US007003120B1

(12) United States Patent
Smith et al.

(10) Patent No.: US 7,003,120 B1
(45) Date of Patent: Feb. 21, 2006

(54) METHOD OF MODIFYING HARMONIC CONTENT OF A COMPLEX WAVEFORM

(75) Inventors: Paul Reed Smith, Lothian, MD (US); Jack W. Smith, Belle Haven, VA (US)

(73) Assignee: Paul Reed Smith Guitars, Inc., Stevensville, MD (US)

( * ) Notice: Subject to any disclaimer, the term of this patent is extended or adjusted under 35 U.S.C. 154(b) by 0 days.

(21) Appl. No.: 09/430,293

(22) Filed: Oct. 29, 1999

Related U.S. Application Data

(60) Provisional application No. 60/106,150, filed on Oct. 29, 1998.

(51) Int. Cl.
*H03G 3/00* (2006.01)

(52) U.S. Cl. ........................... 381/61; 381/98; 381/103

(58) Field of Classification Search .................. 381/61; 84/626, 662, 701, 737, 697, 698, 699, 625
See application file for complete search history.

(56) References Cited

U.S. PATENT DOCUMENTS

| | | | |
|---|---|---|---|
| 3,591,699 | A | 7/1971 | Coller |
| 4,050,343 | A | 9/1977 | Moog |
| 4,357,852 | A | 11/1982 | Suenaga |
| 4,424,415 | A | 1/1984 | Lin |
| 4,736,433 | A | 4/1988 | Dolby |
| 4,833,714 | A | 5/1989 | Shimotani et al. |
| 5,185,806 | A | 2/1993 | Dolby et al. |
| 5,218,160 | A | 6/1993 | Grob-Da Veiga |
| 5,442,129 | A | 8/1995 | Mohrlok et al. |
| 5,504,270 | A | 4/1996 | Sethares |
| 5,524,074 | A | 6/1996 | Massie |
| 5,536,902 | A | 7/1996 | Serra et al. |
| 5,574,823 | A | 11/1996 | Hassanein et al. |
| 5,638,454 | A | 6/1997 | Jones et al. |
| 5,742,927 | A | 4/1998 | Crozier et al. |
| 5,745,581 | A | 4/1998 | Eatwell et al. |
| 5,748,747 | A | 5/1998 | Massie |
| 5,749,073 | A | 5/1998 | Slaney |
| 5,750,912 | A | 5/1998 | Matsumoto |
| 5,768,473 | A | 6/1998 | Eatwell et al. |
| 5,841,875 | A | 11/1998 | Kuroki et al. |

(Continued)

FOREIGN PATENT DOCUMENTS

| | | |
|---|---|---|
| WO | WO 99/08380 | 2/1999 |

OTHER PUBLICATIONS

Harris C. M., Weiss M.R. (1963): "Pitch extraction by computer processing of high-resolution Fourier analysis data," J. Acoust. Soc. Am. 35, 339-335 [8.5.3].

(Continued)

*Primary Examiner*—Brian T. Pendleton
(74) *Attorney, Agent, or Firm*—Barnes & Thornburg LLP

(57) ABSTRACT

A method of manipulating a complex waveform by considering the harmonic and partial frequencies as moving targets over time in both amplitude and frequency and adjusting the moving targets by moving modifiers in both amplitude and frequency. The manipulation of harmonic frequencies and the synthesis of harmonic frequencies are based on the harmonic rank. The modifiers move with the movement of the frequencies based on rank. Harmonic transformation modifies, by rank, the waveform from one source to a waveform of a second or target source. Harmonics and other partials accentuation identifies each of the frequencies and its relationship to adjacent frequencies as well as fixed or moving thresholds and make the appropriate adjustment. Interpolation is also disclosed as well as models which imitate natural harmonics.

43 Claims, 10 Drawing Sheets

U.S. PATENT DOCUMENTS

| | | | | |
|---|---|---|---|---|
| 5,841,876 | A * | 11/1998 | Gifford et al. | 381/71.14 |
| 5,847,303 | A | 12/1998 | Matsumoto | |
| 5,864,813 | A | 1/1999 | Case | |
| 5,901,233 | A * | 5/1999 | Hockney et al. | 381/94.3 |
| 5,930,373 | A | 7/1999 | Shashoua et al. | |
| 5,942,709 | A | 8/1999 | Szalay | |
| 5,973,252 | A | 10/1999 | Hildebrand | |
| 5,987,413 | A | 11/1999 | Dutoit et al. | |
| 6,011,211 | A | 1/2000 | Abrams et al. | |
| 6,015,949 | A | 1/2000 | Oppenheim et al. | |
| 6,023,513 | A | 2/2000 | Case | |
| 6,504,935 | B1 * | 1/2003 | Jackson | 381/61 |

OTHER PUBLICATIONS

Parsons T.W. (1976): "Separation of speech from interfering speech by means of harmonic selection," J. Acoust. Soc. Am. 60, 911-918.

Quatieri, T. (2002): "Discrete-time speech signal processing: Principles and practice," Prentice-Hall, Ch. 10.

Seneff, S. (1976): "Real-time harmoic pitch detector," J. Acoust. Soc. Am. 60 (A), S107 (Paper RR6; $92^{nd}$ Meet. ASA) [8.1; 8.5.3].

Seneff, S. (1978): "Real-time harmonic pitch detector," IEEE Trans. ASSP-26, 358-364 [8.1;8.5.3; 8.5.4].

Seneff, S. (1982): "System to independently modify excitation and/or spectrum of speech waveform without explicit pitch extraction," IEEE Trans. ASSP-30, 566-578 [9.4.4; 9.4.5].

Frazier, R., Samsam, S., Braida, L., Oppenheim, A. (1976): "Enhancement of speech by adaptive filtering," Proc. IEEE Int'l Conf. on Acoust., Speech, and Signal Processing, 251-253.

Lim, J., Oppenheim, A., Braida, L. (1978): "Evaluation of an adaptive comb filtering method for enhancing speech degraded by white noise addition," IEEE Trans. ASSP-26 (4), 354-358.

Hess, W. (1983): "Pitch determination of speech signals: Algorithms and devices," Springer-Verlag, 343-470.

Kyma: Computer Product for Resynthesis and Sound Manipulation, Symbolic Sound Corp. (Champaign, IL).

Ionizer: Computer Product for Sound Morphing and Manipulation, Arboretum Systems, Inc. (Pacifica, N.Y.).

AES vol. 43, No. 9, Sep. 1995: Timbre Morphing of Sounds with Unequal Numbers of Features, E. Tellman, L. Haken and B. Holloway.

D I N R: Intelligent Noise Reduction Computer Product, DigiDesign (Palo Alto, CA).

University of Illinois, Lippold Haken Ph.D. Thesis, 1989: Real-Time Fourier Synthesis of Ensembles with Timbral Interpolation, Urbana, Illinois.

AES vol. 43, No. 12, Dec. 1995: Perceptual Evaluation of Principal-Component-Based Synthesis of Musical Timbres; G.J. Sandell and W.L. Martens.

* cited by examiner

FIG. 8a FLUTE EARLY IN NOTE
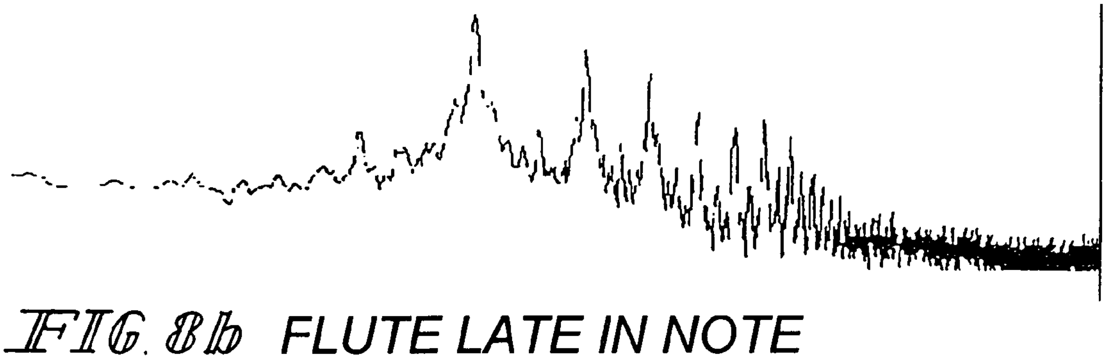
FIG. 8b FLUTE LATE IN NOTE
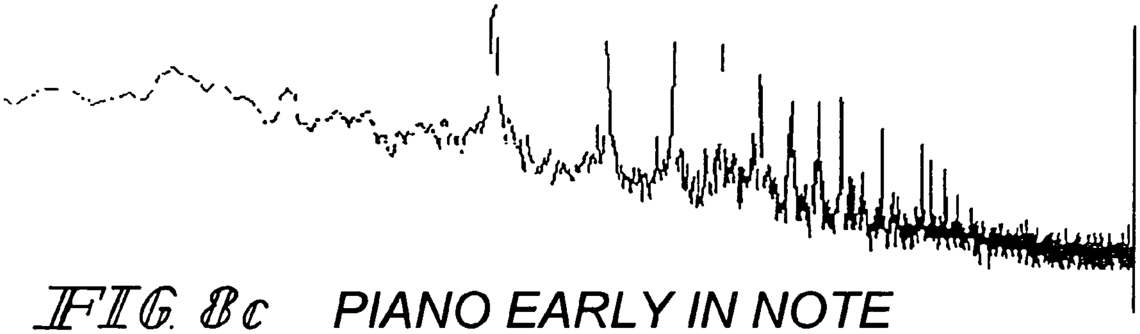
FIG. 8c PIANO EARLY IN NOTE
FIG. 8d PIANO LATE IN NOTE

METHOD OF MODIFYING HARMONIC CONTENT OF A COMPLEX WAVEFORM

CROSS-REFERENCE

This application is related to and claims the benefit of Provisional Patent Application Ser. No. 60/106,150 filed Oct. 29, 1998 which is incorporated herein by reference.

GLOSSARY, BACKGROUND, AND SUMMARY OF THE INVENTION

The present invention relates generally to audio signal processing and waveform processing, and the modification of harmonic content of periodic audio signals and more specifically to methods for dynamically altering the harmonic content of such signals for the purpose of changing their sound or perception of their sound.

Many terms used in this patent are collected and defined in this section.

The quality or timbre of the tone is the characteristic which allows it to be distinguished from other tones of the same frequency and loudness or amplitude. In less technical terms, this aspect gives a musical instrument its recognizable personality or character, which is due in large part to its harmonic content over time.

Most sound sources, including musical instruments, produce complex waveforms that are mixtures of sine waves of various amplitudes and frequencies. The individual sine waves contributing to a complex tone, when measured in finite disjointed time periods, are called its partial tones, or simply partials. A partial or partial frequency is defined as a definitive energetic frequency band, and harmonics or harmonic frequencies are defined as partials which are generated in accordance with a phenomenon based on an integer relationship such as the division of a mechanical object, e.g., a string, or of an air column, by an integral number of nodes. The tone quality or timbre of a given complex tone is determined by the quantity, frequency, and amplitude of its disjoint partials, particularly their amplitude proportions relative to each other and relative frequency to others (i.e., the manner in which those elements combine or blend). Frequency alone is not a determining factor, as a note played on an instrument has a similar timbre to another note played on the same instrument. In embodied systems handling sounds, partials actually represent energy in a small frequency band and are governed by sampling rates and uncertainty issues associated with sampling systems.

Audio signals, especially those relating to musical instruments or human voices, have characteristic harmonic contents that define how the signals sound. Each signal consists of a fundamental frequency and higher-ranking harmonic frequencies. The graphic pattern for each of these combined cycles is the waveform. The detailed waveform of a complex wave depends in part on the relative amplitudes of its harmonics. Changing the amplitude, frequency, or phase relationships among harmonics changes the ear's perception of the tone's musical quality or character.

The fundamental frequency (also called the 1st harmonic, or f1) and the higher-ranking harmonics ($f_2$ through $f_N$) are typically mathematically related. In sounds produced by typical musical instruments, higher-ranking harmonics are mostly, but not exclusively, integer multiples of the fundamental: The 2nd harmonic is 2 times the frequency of the fundamental, the 3rd harmonic is 3 times the frequency of the fundamental, and so on. These multiples are ranking numbers or ranks. In general, the usage of the term harmonic in this patent represents all harmonics, including the fundamental.

Each harmonic has amplitude, frequency, and phase relationships to the fundamental frequency; these relationships can be manipulated to alter the perceived sound. A periodic complex tone may be broken down into its constituent elements (fundamental and higher harmonics). The graphic representation of this analysis is called a spectrum. A given note's characteristic timbre may be represented graphically, then, in a spectral profile.

While typical musical instruments often produce notes predominantly containing integer-multiple or near integer-multiple harmonics, a variety of other instruments and sources produce sounds with more complex relationships among fundamentals and higher harmonics. Many instruments create partials that are non-integer in their relationship. These tones are called inharmonicities.

The modern equal-tempered scale (or Western musical scale) is a method by which a musical scale is adjusted to consist of 12 equally spaced semitone intervals per octave. The frequency of any given half-step is the frequency of its predecessor multiplied by the 12th root of 2 or 1.0594631. This generates a scale where the frequencies of all octave intervals are in the ratio 1:2. These octaves are the only consonant intervals; all other intervals are dissonant.

The scale's inherent compromises allow a piano, for example, to play in all keys. To the human ear, however, instruments such as the piano accurately tuned to the tempered scale sound quite flat in the upper register because harmonics in most mechanical instruments are not exact multiples and the "ear knows this", so the tuning of some instruments is "stretched," meaning the tuning contains deviations from pitches mandated by simple mathematical formulas. These deviations may be either slightly sharp or slightly flat to the notes mandated by simple mathematical formulas. In stretched tunings, mathematical relationships between notes and harmonics still exist, but they are more complex. The relationships between and among the harmonic frequencies generated by many classes of oscillating/vibrating devices, including musical instruments, can be modeled by a function $$f_n = f_1 \times G(n)$$

where $f_n$ is the frequency of the $n^{th}$ harmonic, and n is a positive integer which represents the harmonic ranking number. Examples of such functions are a) $f_n = f_1 \times n$ b) $f_n = f_1 \times n \times [1+(n^2-1)\beta]^{1/2}$ where β is constant which depends on the instrument or on the string of multiple-stringed devices, and sometimes on the frequency register of the note being played.

An audio or musical tone's perceived pitch is typically (but not always) the fundamental or lowest frequency in the periodic signal. As previously mentioned, a musical note contains harmonics at various amplitude, frequencies, and phase relationships to each other. When superimposed, these harmonics create a complex time-domain signal. The differing amplitudes of the harmonics of the signal give the strongest indication of its timbre, or musical personality.

Another aspect of an instrument's perceived musical tone or character involves resonance bands, which are certain fragments or portions of the audible spectrum that are emphasized or accented by an instrument's design, dimensions, materials, construction details, features, and methods of operation. These resonance bands are perceived to be louder relative to other fragments of the audible spectrum.

Such resonance bands are fixed in frequency and remain constant as different notes are played on the instrument. These resonance bands do not shift with respect to different notes played on the instrument. They are determined by the physics of the instrument, not by the particular note played at any given time.

A key difference between harmonic content and resonance bands lies in their differing relationships to fundamental frequencies. Harmonics shift along with changes in the fundamental frequency (i.e., they move in frequency, directly linked to the played fundamental) and thus are always relative to the fundamental. As fundamentals shift to new fundamentals, their harmonics shift along with them.

In contrast, an instrument's resonance bands are fixed in frequency and do not move linearly as a function of shifting fundamentals.

Aside from a note's own harmonic structure and the instrument's own resonance bands, other factors contributing to an instrument's perceived tone or musical character entail the manner in which harmonic content varies over the duration of a musical note. The duration or "life span" of a musical note is marked by its attack (the characteristic manner in which the note is initially struck or sounded); sustain (the continuing characteristics of the note as it is sounded over time); and decay (the characteristic manner in which the note terminates—e.g., an abrupt cut-off vs. a gradual fade), in that order.

A note's harmonic content during all three phases—attack, sustain, and decay—give important perceptual keys to the human ear regarding the note's subjective tonal quality. Each harmonic in a complex time-domain signal, including the fundamental, has its own distinct attack and decay characteristics, which help define the note's timbre in time.

Because the relative amplitude levels of the harmonics may change during the life span of the note in relation to the amplitude of the fundamental (some being emphasized, some de-emphasized), the timbre of a specific note may accordingly change across its duration. In instruments that are plucked or struck (such as pianos and guitars), higher-order harmonics decay at a faster rate than lower-order harmonics. By contrast, on instruments that are continually exercised, including wind instruments (such as the flute) and bowed instruments (such as the violin), harmonics are continually generated.

On a guitar, for example, the two most influential factors, which shape the perceived timbre, are: (1) the core harmonics created by the strings; and (2) the resonance band characteristics of the guitar's body.

Once the strings have generated the fundamental frequency and its associated core set of harmonics, the body, bridge, and other components come into play to further shape the timbre primarily by its resonance characteristics, which are non-linear and frequency dependent. A guitar has resonant bands or regions, within which some harmonics of a tone are emphasized regardless of the frequency of the fundamental.

A guitarist may play the exact same note (same frequency, or pitch) in as many as six places on the neck using different combinations of string and fret positions. However, each of the six versions will sound quite distinct due to different relationships between the fundamental and its harmonics. These differences in turn are caused by variations in string composition and design, string diameter and/or string length. Here, "length" refers not necessarily to total string length but only to the vibrating portion which creates musical pitch, i.e., the distance from the fretted position to the bridge. The resonance characteristics of the body itself do not change, and yet because of these variations in string diameter and/or length, the different versions of the same pitch sound noticeably different.

In many cases it is desired to affect the timbre of an instrument. Modern and traditional methods do so in a rudimentary form with a kind of filter called a fixed-band electronic equalizer. Fixed-band electronic equalizers affect one or more specified fragments, or bands, within a larger frequency spectrum. The desired emphasis ("boost") or de-emphasis ("cut") occurs only within the specified band. Notes or harmonics falling outside the band or bands are not affected.

A given frequency can have any harmonic ranking depending on its relationship relative to the changing fundamental. A resonant band filter or equalizer recognizes a frequency only as being inside or outside its fixed band; it does not recognize or respond to that frequency's harmonic rank. The device cannot distinguish whether the incoming frequency is a fundamental, a 2nd harmonic, a 3rd harmonic, etc. Therefore, the effects of fixed-band equalizers do not change or shift with respect to the frequency's rank. The equalization remains fixed, affecting designated frequencies irrespective of their harmonic relationships to fundamentals. While the equalization affects the levels of the harmonics which does significantly affect the perceived timbre, it does not change the inherent "core" harmonic content of a note, voice, instrument, or other audio signal. Once adjusted, whether the fixed-band equalizer has any effect at all depends solely upon the frequency itself of the incoming note or signal. It does not depend upon whether that frequency is a fundamental (1st harmonic), 2nd harmonic, 3rd harmonic, or some other rank.

Some present day equalizers have the ability to alter their filters dynamically, but the alterations are tied to time cues rather than harmonic ranking information. These equalizers have the ability to adjust their filtering in time by changing the location of the filters as defined by user input commands. One of the methods of the present invention, may be viewed as a 1000-band or more graphic equalizer, but is different in that the amplitude and the corresponding affected frequencies are instantaneously changing in frequency and amplitude and/or moving at very fast speeds with respect to frequency and amplitude to change the harmonic energy content of the notes; and working in unison with a synthesizer adding missing harmonics and all following and anticipating the frequencies associated with the harmonics set for change.

The human voice may be thought of as a musical instrument, with many of the same qualities and characteristics found in other instrument families. Because it operates by air under pressure, it is fundamentally a wind instrument, but in terms of frequency generation the voice resembles a string instrument in that multiple-harmonic vibrations are produced by pieces of tissue whose vibration frequency can be varied by adjusting their tension.

Unlike an acoustic guitar body, with its fixed resonant chamber, some of the voice's resonance bands are instantly adjustable because certain aspects of the resonant cavity may be altered by the speaker, even many times within the duration of a single note. Resonance is affected by the configuration of the nasal cavity and oral cavity, the position of the tongue, and other aspects of what in its entirety is called the vocal tract.

PRIOR ART

U.S. Pat. No. 5,847,303 to Matsumoto describes a voice processing apparatus that modifies the frequency spectrum of a human voice input. The patent embodies several processing and calculation steps to equalize the incoming voice signal so as to make it sound like that of another voice (that of a professional singer, for example). It also provides a claim to be able to change the perceived gender of the singer.

The frequency spectrum modification of the Matsumoto Patent is accomplished by using traditional resonant band type filtering methods, which simulate the shape of the vocal tract or resonator by analyzing the original voice. Related coefficients for compressor/expander and filters are stored in the device's memory or on disk, and are fixed (not selectable by the end user). The frequency-following effect of the Matsumoto Patent is to use fundamental-frequency information from the voice input to offset and tune the voice to the "proper" or "correct" pitch. Pitch change is accomplished via electronic clock rate manipulations that shift the format frequencies within the tract. This information is subsequently fed to an electronic device which synthesizes complete waveforms. Specific harmonics are not synthesized not individually adjusted with respect to the fundamental frequency, the whole signal is treated the same.

A similar Matsumoto Patent 5,750,912 is voice modifying apparatus for modifying a single voice to emulate a model voice. An analyzer sequentially analyzes the collected singing voice to extract therefrom actual formant data representing resonance characteristics of a singer's own vocal organ which is physically activated to create the singing voice. A sequencer operates in synchronization with progression of the singing voice for sequentially providing reference formant data which indicates a vocal quality of the model voice and which is arranged to match with the progression of the singing voice. A comparator sequentially compares the actual formant data and the reference formant with each other to detect a difference therebetween during the progression of the singing voice. An equalizer modifies frequency characteristics of the collected singing voice according to the detected difference so as to emulate the vocal quality of the model voice. The equalizer comprises a plurality of band pass filters having adjustable center frequencies and adjustable gains. The band pass filters have the individual frequency characteristics based on the peak frequencies of the formant, peak frequencies and peak levels.

U.S. Pat. No. 5,536,902 to Serra et al. describes a method of and apparatus for analyzing and synthesizing a sound by extracting and controlling a sound parameter. It employs a spectral modeling synthesis technique (SMS). Analysis data are provided which are indicative of plural components making up an original sound waveform. The analysis data are analyzed to obtain a characteristic concerning a predetermined element, and then data indicative of the obtained characteristic is extracted as a sound or musical parameter. The characteristic corresponding to the extracted musical parameter is removed from the analysis data, and the original sound waveform is represented by a combination of the thus-modified analysis data and the musical parameter. These data are stored in a memory. The user can variably control the musical parameter. A characteristic corresponding to the controlled musical parameter is added to the analysis data. In this matter, a sound waveform is synthesized on the basis of the analysis data to which the controlled characteristic has been added. In such a sound synthesis technique of the analysis type, it is allowed to apply free controls to various sound elements such as a formant and a vibrato.

U.S. Pat. No. 5,504,270 to Sethares is method and apparatus for analyzing and reducing or increasing the dissonance of an electronic audio input signal by identifying the partials of the audio input signal by frequency and amplitude. The dissonance of the input partials is calculated with respect to a set of reference partials according to a procedure disclosed herein. One or more of the input partials is then shifted, and the dissonance re-calculated. If the dissonance changes in the desired manner, the shifted partial may replace the input partial from which it was derived. An output signal is produced comprising the shifted input partials, so that the output signal is more or less dissonant that the input signal, as desired. The input signal and reference partials may come from different sources, e.g., a performer and an accompaniment, respectively, so that the output signal is a more or less dissonant signal than the input signal with respect to the source of reference partials. Alternatively, the reference partials may be selected from the input signal to reduce the intrinsic dissonance of the input signal.

U.S. Pat. No. 5,218,160 to Grob-Da Veiga describes a method for enhancing stringed instrument sounds by creating undertones or overtones. The invention employs a method for extracting the fundamental frequency and multiplying that frequency by integers or small fractions to create harmonically related undertones or overtones. Thus the undertones and overtones are derived directly from the fundamental frequency.

U.S. Pat. No. 5,749,073 to Slaney addresses the automatic morphing of audio information. Audio morphing is a process of blending two or more sounds, each with recognizable characteristics, into a new sound with composite characteristics of both original sources.

Slaney uses a multi-step approach. First, the two different input sounds are converted to a form which allows for analysis, such that they can be matched in various ways, recognizing both harmonic relationships and inharmonic relationships. Once the inputs are converted, pitch and format frequencies are used for matching the two original sounds. Once matched, the sounds are cross-faded (i.e., summed, or blended in some pre-selected proportion) and then inverted to create a new sound which is a combination of the two sounds. The method employed uses pitch changing and spectral profile manipulation through filtering. As in the previously mentioned patents, the methods entail resonant type filtering and manipulation of the format information.

Closely related to the Slaney patent is a technology described in an article by E. Tellman, L. Haken, and B. Holloway titled "Timbre Morphing of Sounds with Unequal Numbers of Features" (*Journal of Audio Engineering Society*, Vol. 43, No. 9, September 1995). The technology entails an algorithm for morphing between sounds using Lemur analysis and synthesis. The Tellman/Haken/Holloway timbre-morphing concept involves time-scale modifications (slowing down or speeding up the passage) as well as amplitude and frequency modification of individual sinusoidal (sine wave-based) components.

U.S. Pat. No. 4,050,343 by Robert A. Moog relates to an electronic music synthesizer. The note information is derived from the keyboard key pressed by the user. The pressed keyboard key controls a voltage/controlled oscillator whose outputs control a band pass filter, a low pass filter and an output amplifier. Both the center frequency and band width of the band pass filters are adjusted by application of the control voltage. The low pass cut-off frequency of the low pass filter is adjusted by application of the control voltage and the gain of the amplifier is adjusted by the control voltage.

In a product called Ionizer [Arboretum Systems], a method starts by using a "pre-analysis" to obtain a spectrum of the noise contained in the signal—which is only characteristic of the noise. This is actually quite useful in audio systems, since tape hiss, recording player noise, hum, and buzz are recurrent types of noise. By taking a sound print, this can be used as a reference to create "anti-noise" and subtract that (not necessarily directly) from the source signal. The usage of "peak finding" in the passage within the Sound Design portion of the program implements a 512-band gated EQ, which can create very steep "brick wall" filters to pull out individual harmonics or remove certain sonic elements. They implement a threshold feature that allows the creation of dynamic filters. But, yet again, the methods employed do not follow or track the fundamental frequency, and harmonic removal again must fall in a frequency band, which then does not track the entire passage for an instrument.

Kyma-5 is a combination of hardware and software developed by Symbolic Sound. Kyma-5 is software that is accelerated by the Capybara hardware platform. Kyma-5 is primarily a synthesis tool, but the inputs can be from an existing recorded sound files. It has real-time processing capabilities, but predominantly is a static-file processing tool. An aspect of Kyma-5 is the ability to graphically select partials from a spectral display of the sound passage and apply processing. Kyma-5 approaches selection of the partials visually and identifies "connected" dots of the spectral display within frequency bands, not by harmonic ranking number. Harmonics can be selected if they fall within a manually set band. Kyma-5 is able to re-synthesize a sound or passage from a static file by analyzing its harmonics and applying a variety of synthesis algorithms, including additive synthesis. However, there is no automatic process for tracking harmonics with respect to a fundamental as the notes change over time. Kyma-5 allows the user selection of one fundamental frequency. Identification of points on the Kyma spectral analysis tool may identify points that are strictly non-harmonic. Finally, Kyma does not apply stretch constants to the sounds.

Methods and Results of Invention

The present invention affects the tonal quality, or timbre, of a signal, waveform, note or other signal generated by any source, by modifying specific harmonics of each and every fundamental and/or note, in a user-prescribed manner, as a complex audio signal progresses through time. For example, the user-determined alterations to the harmonics of a musical note (or other signal waveform) could also be applied to the next note or signal, and to the note or signal after that, and to every subsequent note or signal as a passage of music progresses through time. It is important to note that all aspects of this invention look at notes, sounds, partials, harmonics, tones, inharmonicities, signals, etc. as moving targets over time in both amplitude and frequency and adjust the moving targets by moving modifiers adjustable in amplitude and frequency over time.

The invention embodies methods for:

- dynamically and individually altering the energy of any harmonic ($f_1$ through $f\infty$) of complex waveform;
- creating new harmonics (such as harmonics "missing" from a desired sound) with a defined amplitude and phase relationship to any other harmonics;
- identifying and imitating naturally occurring harmonics in synthesized sounds based on integer or user-defined harmonic relationships, such as $f_n=f_1\times n\times(S)\log2(n)$;
- extracting, modifying, and reinserting harmonics into notes;
- interpolating signals depending on frequency, amplitude, and/or other parameters to enable adjusting the harmonic structure of selected notes, then shifting the harmonic structure of signals all across the musical range from one of those user-adjusted points to the other according to any of several user-prescribed curves or contours;
- dynamically altering attack rates, decay rates, and/or sustain parameters of harmonics;
- separating any harmonics from a complex signal for processing of various types;
- changing the levels of partials within a signal based on their frequency and amplitude;
- continuously changing the levels of a complex signal's harmonics based on their ranking and amplitude;
- increasing or decreasing harmonics by a fixed amount or by variable amounts, either throughout an entire selected passage, or at any portion within that passage;
- restoring characteristic information of the source signal that may have been lost, damaged, or altered in either the recording process or through deterioration of original magnetic or other media of recorded information;
- calculation of partial and harmonic locations using the $f_n=f_1\times n\times(S)\log2(n)$ stretch function;
- harmonically transforming one sound signal to match, resemble, or partially resemble that of another signal type utilizing combinations of the aforementioned embodiments of harmonic adjustment and harmonic synthesis;
- providing a basis for new musical instruments including but not limited to new types of guitar synthesizers, bass synthesizers, guitars, basses, pianos, keyboards, studio sound-modification equipment, mastering sound-modification equipment, new styles of equalization devices, and new audio digital hardware and software technologies pertaining to the aforementioned methods to alter a note, sound, or signal;
- highlighting previously hard-to-hear harmonics, partials, or portions of sounds or signals, within an aggregation of other such signals;
- canceling noise or reducing noise;
- smoothing out or attenuating previously harsh or overly prominent voices, instruments, musical notes, harmonics, partials, other sounds or signals, or portions of sounds or signals;
- enhancing low-volume and/or attenuating or diminishing relatively high-volume sound signals in a passage of music or other complex time-domain signals;
- eliminate certain amplitude ranges of partials such that lower level information can be more easily discerned and/or processed;

Summary of Methods

This processing is not limited to traditional musical instruments, but may be applied to any incoming source signal waveform or material to alter its perceived quality, to enhance particular aspects of timbre, or to de-emphasize particular aspects. This is accomplished by the manipulation of individual harmonics and/or partials of the spectrum for a given signal. With the present invention, adjustment of a harmonics or partials is over a finite or relatively short period of time. This differs from the effect of generic, fixed-band equalization, which is maintained over an indefinite or relatively long period of time.

The assigned processing is accomplished by manipulating the energy level of a harmonic (or group of harmonics), or by generating a new harmonic (or group of harmonics) or partials, or by fully removing a harmonic (or group of harmonics) or partials. The manipulations can be tied to the response of any other harmonic or it can be tied to any frequency or ranking number(s) or other parameter the user selects. Adjustments can also be generated independently of existing harmonics. In some cases, multiple manipulations using any combination of methods may be used. In others, a harmonic or group of harmonics may be separated out for individual processing by various means. In still others, partials can be emphasized or de-emphasized.

The preferred embodiment of the manipulation of the harmonics uses Digital Signal Processing (DPS) techniques. Filtering and analysis methods are carried out on digital data representations by a computer (e.g. DSP or other microprocessor). The digital data represents an analog signal or complex waveform that has been sampled and converted from an analog electrical waveform to digital data. Upon completion of the digital processing, the data may be converted back to an analog electrical signal. It also may be transmitted in a digital form to another system, as well as being stored locally on some form of magnetic or other storage media. The signal sources are quasi real-time or prerecorded in a digital audio format, and software is used to carry out the desired calculations and manipulations.

Other objects, advantages and novel features of the present invention will become apparent from the following detailed description of the invention when considered in conjunction with the accompanying drawings.

DESCRIPTION OF DRAWINGS

FIGS. 8A, 8B, 8C and 8D illustrate the spectral content of a flute and piano at times both early and late in the same note as it relates to Harmonic Transformation.

DETAILED DESCRIPTION OF THE PREFERRED EMBODIMENTS HARMONIC ADJUSTMENT

The goal of harmonic adjustment and synthesis is to manipulate the characteristics of harmonics on an individual basis based on their ranking numbers. The manipulation is over the time period that a particular note has amplitude. A harmonic may be adjusted by applying filters centered at its frequency. Throughout this invention, a filter may also be in the form of an equalizer, mathematical model, or algorithm. The filters are calculated based on the harmonic's location in frequency, amplitude, and time with respect either to any other harmonic. Again, this invention looks at harmonics as moving frequency and amplitude targets.

The present invention "looks ahead" to all manners of shifts in upcoming signals and reacts according to calculation and user input and control.

"Looking ahead" in quasi real-time actually entails collecting data for a minimum amount of time such that appropriate characteristics of the incoming data (i.e. audio signal) may be recognized to trigger appropriate processing. This information is stored in a delay buffer until needed aspects are ascertained. The delay buffer is continually being filled with new data and unneeded data is removed from the "oldest" end of the buffer when it is no longer needed. This is how a small latency occurs in quasi real-time situations.

Quasi-real time refers to a minuscule delay of up to approximately 60 milliseconds. It is often described as about the duration of up to two frames in a motion-picture film, although one frame delay is preferred.

In the present invention the processing filters anticipate the movement of and move with the harmonics as the harmonics move with respect to the first harmonic ($f_1$). The designated harmonic (or "harmonic set for amplitude adjustment") will shift in frequency by mathematically fixed amounts related to the harmonic ranking. For example, if the first harmonic ($f_1$) changes from 100 Hz to 110 Hz, the present invention's harmonic adjustment filter for the fourth harmonic ($f_4$) shifts from 400 Hz to 440 Hz.

Figure 1:
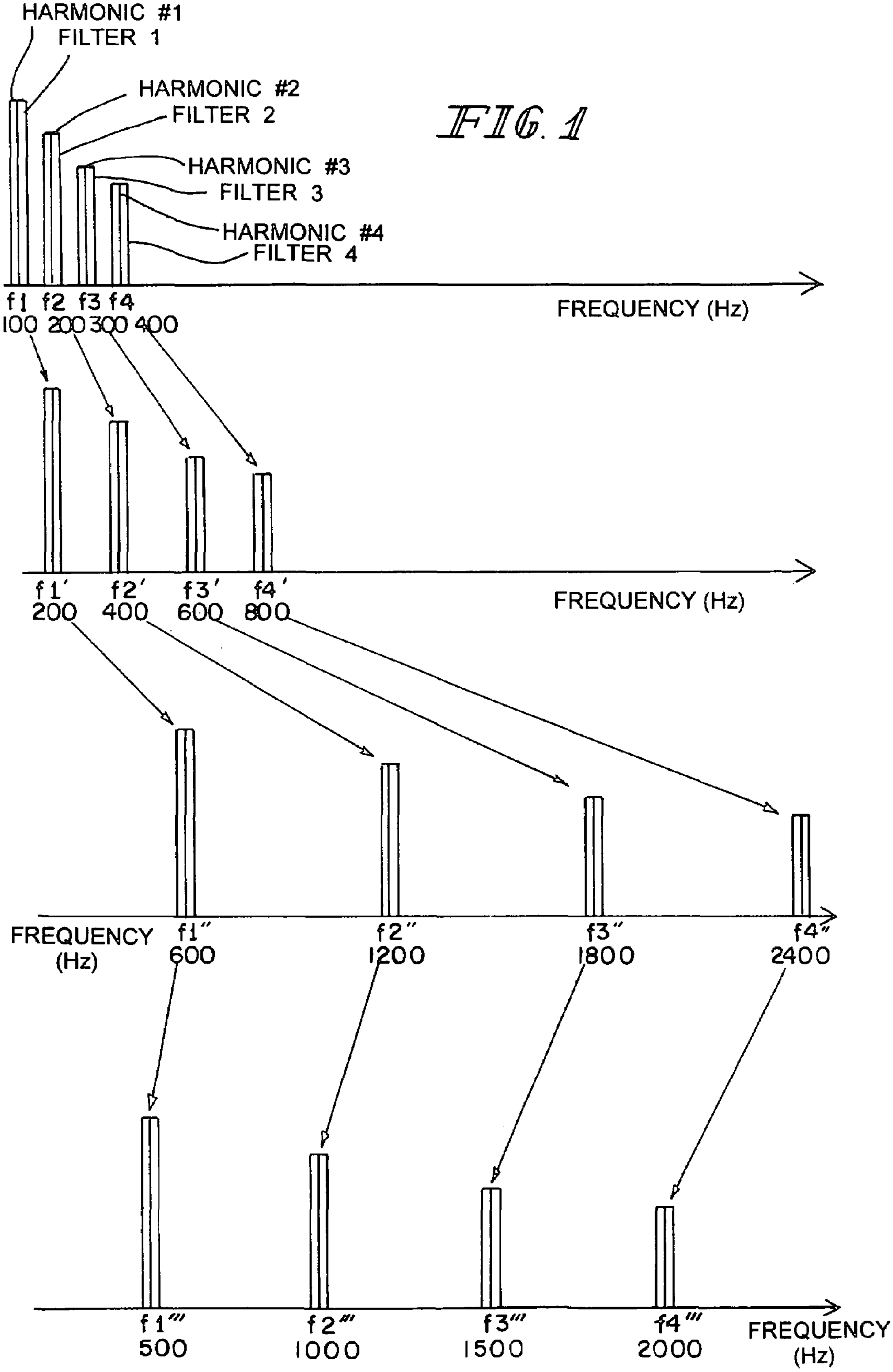
FIG. 1 is four graphs of four notes and four of its harmonics on a frequency versus amplitude scale showing the accordion effect of harmonics as they relate to each other.

FIG. 1 shows a series of four notes and the characteristic harmonic content of four harmonics of each note at a given point in time. This hypothetical sequence shows how the harmonics and filters move with respect to the fundamental, the harmonics, and with respect to each other. The tracking of these moving harmonics in both amplitude and frequency over time is a key element in the processing methods embodied herein.

The separation or distance between frequencies (corresponding to the separation between filters) expands as fundamentals rise in frequency, and contracts as fundamentals lower in frequency. Graphically speaking, this process is to be known herein as the "accordion effect."

The present invention is designed to adjust amplitudes of harmonics over time with filters which move with the non-stationary (frequency changing) harmonics of the signals set for amplitude adjustment.

Specifically, the individual harmonics are parametrically filtered and/or amplified. This increases and decreases the relative amplitudes of the various harmonics in the spectrum of individual played notes based not upon the frequency band in which the harmonics appear (as is presently done with conventional devices), but rather based on their harmonic ranking numbers and upon which harmonic ranks are set to be filtered. This may be done off-line, for example, after the recording of music or complex waveform, or in quasi-real time. For this to be done in quasi-real time, the individual played note's harmonic frequencies are determined using a known frequency detection method or Fast Find Fundamental method, and the harmonic-by-harmonic filtering is then performed on the determined notes.

Because harmonics are being manipulated in this unique fashion, the overall timbre of the instrument is affected with respect to individual, precisely selected harmonics, as opposed to merely affecting fragments of the spectrum with conventional filters assigned to one or more fixed resonance bands.

Figure 2:
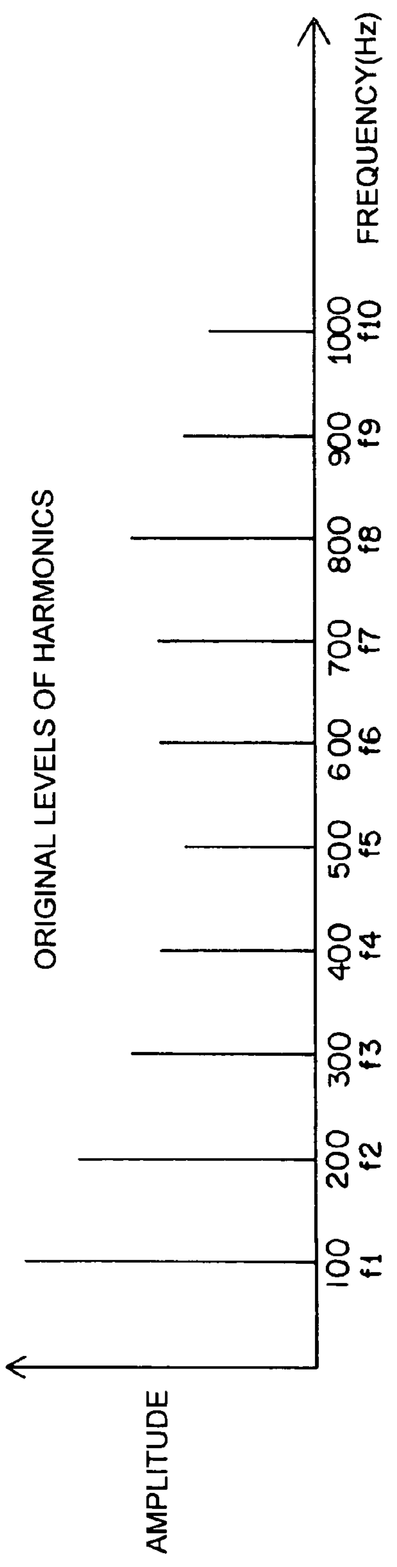
FIG. 2 is a graph of the harmonic content of a note at a particular point in time on a frequency versus amplitude scale.
Figure 3:
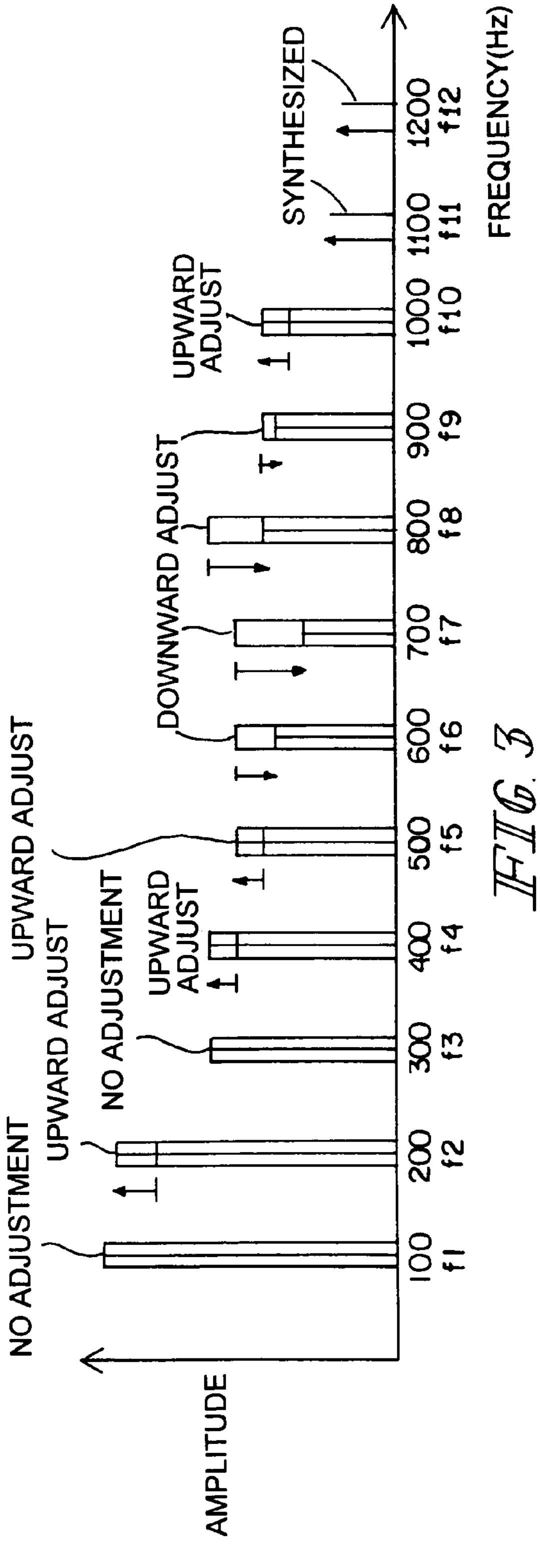
FIG. 3 is an adjustment of the individual frequencies and synthesized frequencies of the note of FIG. 2 incorporating the principles of the present invention.

For the ease of illustration, the model of the harmonic relationship in FIGS. 1–3 will be $f_n=f_1 \times n$.

For example, this form of filtering will filter the 4th harmonic at 400 Hz the same way that it filters the 4th harmonic at 2400 Hz, even though the 4th harmonics of those two notes (note 1 and note 3 of FIG. 1) are in different frequency ranges. This application of the present invention will be useful as a complement to, and/or a replacement for, conventional frequency-band-by-frequency-band equalization devices. The mixing of these individually filtered harmonics of the played notes for output will be discussed with respect to FIGS. 4 and 5.

FIG. 2 shows an example of the harmonic content of a signal at a point in time. The fundamental frequency ($f_1$) is 100 Hz. Thus, in multiples of 100 Hz, one sees the harmonics of this signal at 200 Hz ($f_2=f_1 \times 2$), 300 Hz ($f_3=f_1 \times 3$), 400 Hz ($f_4=f_1 \times 4$), etc. For illustration, this example has a total of 10 harmonics, but actual signals often have many more harmonics.

FIG. 3 shows the adjustment modification, as could be effected with the present invention, of some harmonics of FIG. 2. Harmonics located at 200 Hz (2nd harmonic), 400 Hz (4th harmonic), 500 Hz (5th), and 1000 Hz (10th) are all adjusted upwards in energy content and amplitude. Harmonics at 600 Hz (6th harmonic), 700 Hz (7th harmonic), 800 Hz (8th), and 900 Hz (9th) are all adjusted downward in energy content and amplitude.

With the present invention, harmonics may be either increased or decreased in amplitude by various methods referred herein as amplitude modifying functions. One present-day method is to apply specifically calculated digital filters over the time frame of interest. These filters adjust their amplitude and frequency response to move with the harmonic's frequency being adjusted.

Other embodiments may utilize a series of filters adjacent in frequency or a series of fixed frequency filters, where the processing is handed off in a "bucket-brigade" fashion as a harmonic moves from one filter's range into the next filter's range.

Figure 4:
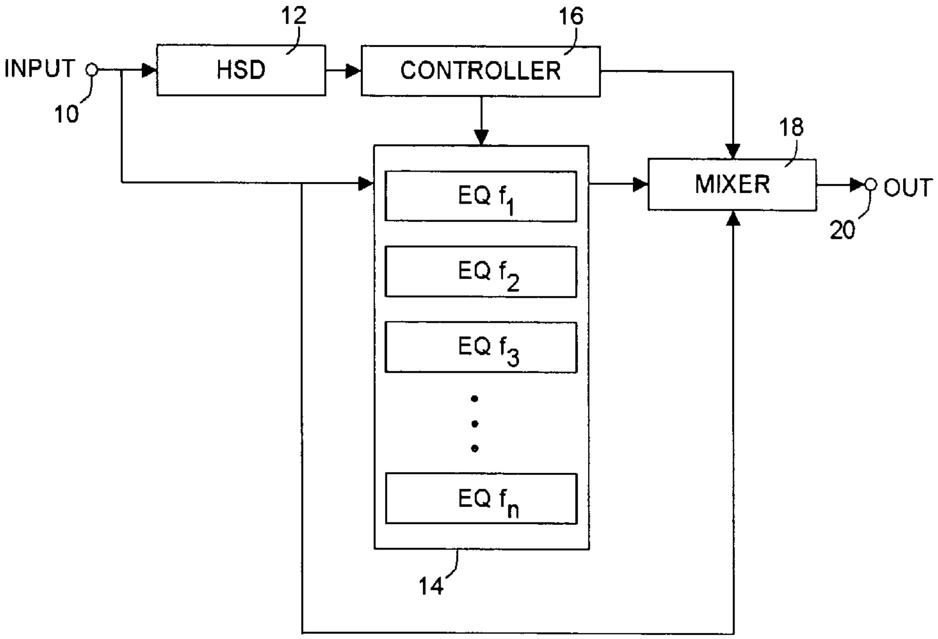
FIG. 4 is a schematic of a first embodiment of a system for performing the method illustrated in FIG. 3 using an amplitude and frequency following filter method according to the present invention.

FIG. 4 shows an implementation embodiment. The signal at input 10, which may be from a pickup, microphone or pre-stored data, is provided to a harmonic signal detector HSD 12 and to a bank of filters 14. Each of the filters in the bank 14 is programmable for a specific harmonic frequency of the harmonic detected signal and is represented by $f_1$, $f_2$, $f_3 \ldots f_N$. A controller 16 adjusts the frequency of each of the filters to the frequency which matches the harmonic frequency detected by harmonic signal detector 12 for its ranking. The desired modification of the individual harmonics is controlled by the controller 16 based on user inputs. The output of the bank of filters 14 are combined in mixer 18 with the input signal from input 10 and provided as combined output signal at output 20 dependent upon the specific algorithm employed. As will be discussed with respect to FIG. 3 below, the controller 16 may also provide synthetic harmonics at the mixer 18 to be combined with the signal from the equalizer bank 14 and the input 10.

Figure 5:
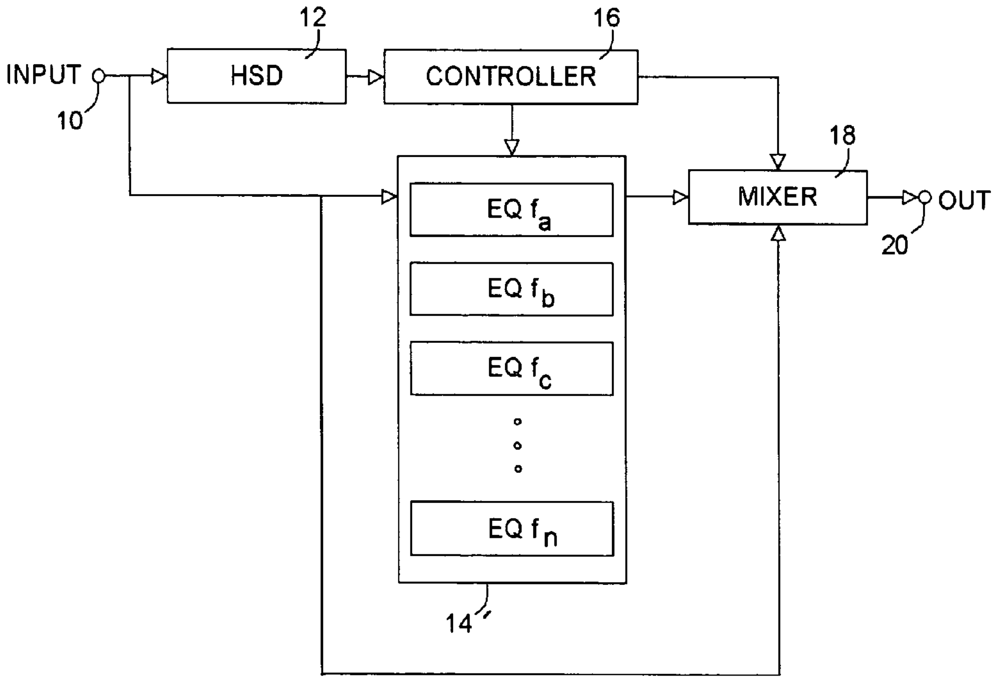
FIG. 5 is a block diagram of a system for performing the method of FIG. 3 using a bucket brigade method according to the present invention.

FIG. 5 shows the system modified to perform the alternate bucket brigade method. The equalizer bank 14' has a bank of filters, each having a fixed frequency adjacent band width represented by Fa, Fb, Fc, etc. The controller 16, upon receipt of the harmonic signal identified by the harmonic signal detector 12 adjusts the signal modification of the characteristic of the fixed band width filters of 14' to match that of the detected harmonic signals. Wherein the filters in bank 14 of FIG. 4 each has its frequency adjusted to and its modification characteristics fixed for the desired harmonic, the equalizers of bank 14' of FIG. 5 each have their frequency fixed and their modification characteristics varied depending upon the detected harmonic signal.

Whether employing the accordion frequency and amplitude adjustable moving filter method or bucket-brigade method of frequency anticipated frequency following, or a combination of these methods, the filtering effect moves in frequency with the harmonic selected for amplitude change, responding not merely to a signal's frequency but to its harmonic rank and amplitude.

Although the harmonic signal detector 12 is shown separate from the controller 16, both may be software in a common DSP or microcomputer.

Preferably, the filters 14 are digital. One advantage of digital filtering is that undesired shifts in phase between the original and processed signals, called phase distortions, can be minimized. In one method of the present invention, either of two digital filtering methods may be used, depending on the desired goal: the Finite Impulse Response (FIR) method, or the Infinite Impulse Response (IIR) method. The Finite Impulse Response method employs separate filters for amplitude adjustment and for phase compensation. The amplitude adjustment filter(s) may be designed so that the desired response is a function of an incoming signal's frequency. Digital filters designed to exhibit such amplitude response characteristics inherently affect or distort the phase characteristics of a data array.

As a result, the amplitude adjustment filter is followed by a second filter placed in series, the phase compensation filter. Phase compensation filters are unity-gain devices, that counteract phase distortions introduced by the amplitude adjustment filter.

Filters and other sound processors may be applied to either of two types of incoming audio signals: real-time, or non-real-time (fixed, or static). Real-time signals include live performances, whether occurring in a private setting, public arena, or recording studio. Once the complex waveform has been captured on magnetic tape, in digital form, or in some other media, it is considered fixed or static; it may be further processed.

Before digital processing can be applied to an incoming signal, that input signal itself must be converted to digital information. An array is a sequence of numbers indicating a signal's digital representation. A filter may be applied to an array in a forward direction, from the beginning of the array to the end; or backward, from the end to the beginning.

In a second digital filtering method, Infinite Impulse Response (IIR), zero-phase filtering may be accomplished with non-real-time (fixed, static) signals by applying filters in both directions across the data array of interest. Because the phase distortion is equal in both directions, the net effect is that such distortion is canceled out when the filters are run in both directions. This method is limited to static (fixed, recorded) data.

One method of this invention utilizes high-speed digital computation devices as well as methods of quantifying digitized music, and improves mathematical algorithms for adjuncts for high-speed Fourier and/or Wavelet Analysis. A digital device will analyze the existing music, adjust the harmonics' volumes or amplitudes to desired levels. This method is accomplished with very rapidly changing, complex pinpoint digital equalization windows which are moving in frequency with harmonics and the desired harmonic level changes as described in FIG. 4.

The applications for this invention can be applied to and not limited to stringed instruments, equalization and filtering devices, devices used in recording, electronic keyboards, instrument tone modifiers, and other waveform modifiers.

Harmonic Synthesis

In many situations where it is desired to adjust the energy levels of a musical note's or other audio signal's harmonic content, it may impossible to do so if the harmonic content is intermittent or effectively nonexistent. This may occur when the harmonic has faded out below the noise "floor" (minimum discernible energy level) of the source signal. With the present invention, these missing or below-floor harmonics may be generated "from scratch," i.e., electronically synthesized.

It might also be desirable to create an entirely new harmonic, inharmonic, or sub-harmonic (a harmonic frequency below the fundamental) altogether, with either an integer-multiplier or non-integer-multiplier relationship to the source signal. Again, this creation or generation process is a type of synthesis. Like naturally occurring harmonics, synthesized harmonics typically relate mathematically to their fundamental frequencies.

As in Harmonic Adjustment, the synthesized harmonics generated by the present invention are non-stationary in frequency: They move in relation to the other harmonics. They may be synthesized relative to any individual harmonic (including $f_1$) and moves in frequency as the note changes in frequency, anticipating the change to correctly adjust the harmonic synthesizer.

As shown in FIG. 2, the harmonic content of the original signal includes frequencies up to 1000 Hz (10th harmonic of the 100 Hz fundamental); there are no 11th or 12th harmonics present. FIG. 3 shows the existence of these missing harmonics as created via Harmonic Synthesis. Thus, the new harmonic spectrum includes harmonics up to 1200 Hz (12th harmonic).

Instruments are defined not only by the relative levels of the harmonics in their audible spectra but also by the phase of the harmonics relative to fundamentals (a relationship which may vary over time). Thus, Harmonic Synthesis also allows creation of harmonics which are both amplitude-correlated and phase-aligned (i.e., consistently rather than arbitrarily matched to, or related to, the fundamental). Preferably, the bank of filters 14 and 14' are digital devices which are also digital sine wave generators, and preferably, the synthetic harmonics are created using a function other than $f_n=f_1\times n$. The preferred relationship is for generating the new harmonics $f_n=f_1\times n\times S^{\log_2 n}$. S is a number greater than 1, for example, 1.002.

Harmonic Adjustment and Synthesis

Combinations of Harmonic Adjustment and Synthesis embody the ability to dynamically control the amplitude of all of the harmonics contained in a note based on their ranking, including those considered to be "missing". This ability to control the harmonics gives great flexibility to the user in manipulating the timbre of various notes or signals to his or her liking. The method recognizes that different manipulations may be desired based on the level of the harmonics of a particular incoming signal. It embodies Harmonic Adjustment and Synthesis. The overall timbre of the instrument is affected as opposed to merely affecting fragments of the spectrum already in existence.

It may be impossible to adjust the energy levels of a signal's harmonic content if that content is intermittent or effectively nonexistent, as when the harmonic fades out below the noise "floor" of the source signal. With the present invention, these missing or below-floor harmonics may be generated "from scratch," or electronically synthesized, and then mixed back in with the original and/or harmonically adjusted signal.

Figure 6:
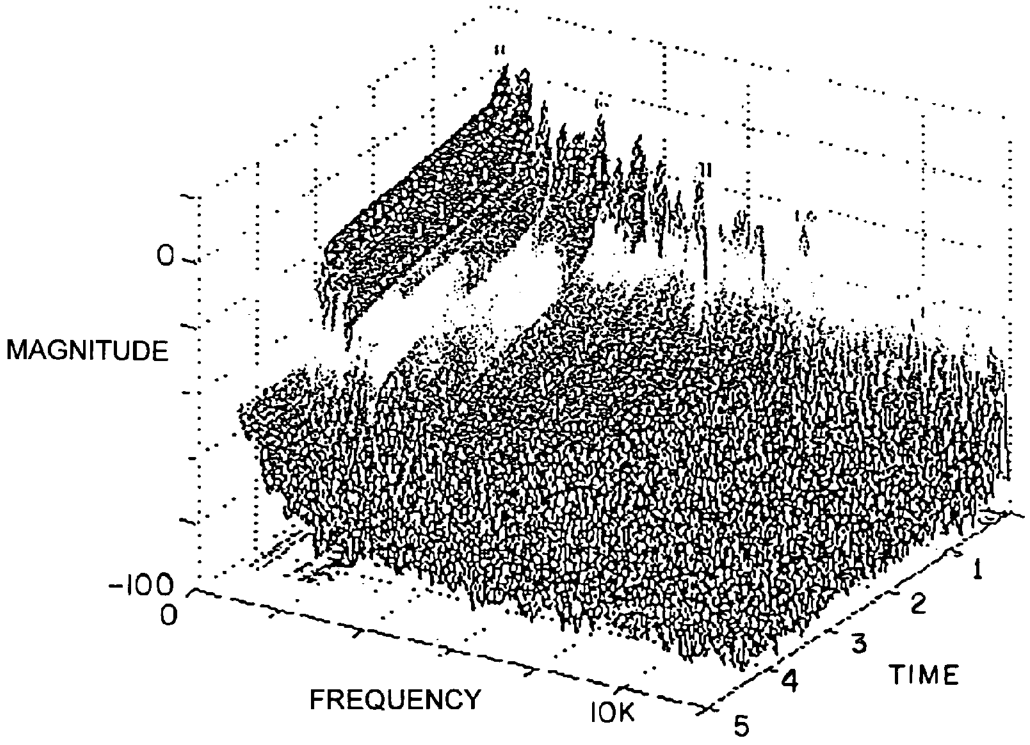
FIG. 6 is a spectral profile graph of a complex waveform from a single strike of a 440 Hertz piano keys as a function of frequency (X axis), time (Y axis), and magnitude (Z axis).
Figure 7:
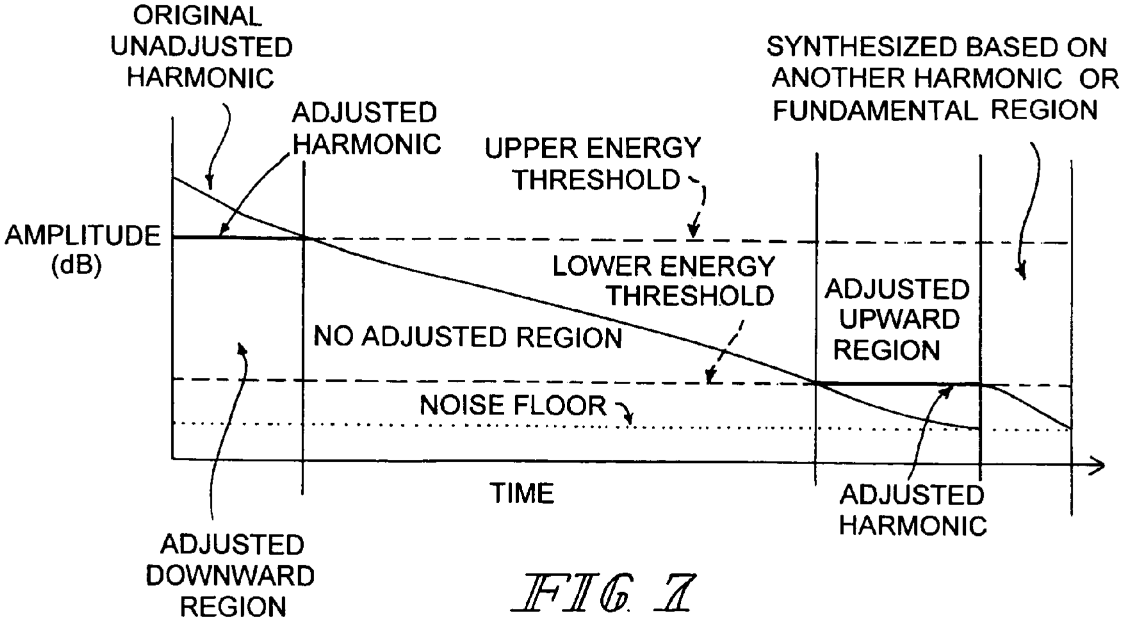
FIG. 7 is a graph of a signal modified according to the principles of Harmonic and other Partial accentuation and/or Harmonic Transformations.

To address this, Harmonic Synthesis may also be used in conjunction with Harmonic Adjustment to alter the overall harmonic response of the source signal. For example, the 10th harmonic of an electric guitar fades away much faster than lower ranking harmonics, as illustrated in FIG. 6. It might be of interest to use synthesis not only to boost the level of this harmonic at the initial portion of the note but also to maintain it throughout the note's entire existence. The synthesis may be carried on throughout all of the notes in the selected sections or passages. Thus, an existing harmonic may be adjusted during the portion where it exceeds a certain threshold, and then synthesized (in its adjusted form) during the remaining portion of the note (see FIG. 7).

It may also be desired to accomplish this for several harmonics. In this case, the harmonic is synthesized with desired phase-alignment to maintain an amplitude at the desired threshold. The phase alignment may be drawn from an arbitrary setting, or the phase may align in some way with a user-selected harmonic. This method changes in frequency and amplitude and/or moves at very fast speeds to change the harmonic energy content of the notes and works in unison with a synthesizer to add missing desired harmonics. These harmonics and synthesized harmonics will be proportional in volume to a set harmonic amplitude at percentages set in a digital device's software. Preferably, the function $f^n=f_1\times n\times S^{\log_2 n}$ is used to generate a new harmonic.

In order to avoid the attempted boosting of a harmonic that does not exist, the present invention employs a detection algorithm to indicate that there is enough of a partial present to make warranted adjustments. Typically, such detection methods are based on the energy of the partial, such that as long as the partial's energy (or amplitude) is above a threshold for some arbitrarily defined time period, it is considered to be present.

Harmonic Transformation

Harmonic Transformation refers to the present invention's ability to compare one sound or signal (the file set for change) to another sound or signal (the second file), and then to employ Harmonic Adjustment and Harmonic Synthesis to adjust the signal set for change so that it more closely resembles the second file or, if desired, duplicates the second file in timbre. These methods combines several aspects of previously mentioned inventions to accomplish an overall goal of combining audio sounds, or of changing one sound to more closely resemble another. It can be used, in fact, to make one recorded instrument or voice sound almost exactly like another instrument or voice.

When one views a given note produced by an instrument or voice in terms of its harmonic frequency content with respect to time (FIG. 6), one sees that each harmonic has an attack characteristic (how fast the initial portion of that harmonic rises in time and how it peaks), a sustain characteristic (how the harmonic structure behaves after the attack portion), and a decay characteristic (how the harmonic stops or fades away at the end of a note). In some cases, a particular harmonic may have faded completely away before the fundamental itself has ended.

Different examples of one type of musical instrument (two pianos, for example) can vary in many ways. One variation is in the harmonic content of a particular complex time-domain signal. For example, a middle "C" note sounded on one piano may have a very different harmonic content than the same note sounded on a different piano.

Another way in which two pianos can differ refers to harmonic content over time. Not only will the same note played on two different pianos have different harmonic structures, but also those structures will behave in different ways over time. Certain harmonics of one note will sustain or fade out in very different manners compared to the behavior over time of the harmonic structure of the same note sounded on a different piano.

By individually manipulating the harmonics of each signal produced by a recorded instrument, that instrument's response can be made to closely resemble or match that of a different instrument. This technique is termed harmonic transformation. It can consist of dynamically altering the harmonic energy levels within each note and shaping their energy response in time to closely match harmonic energy levels of another instrument. This is accomplished by frequency band comparisons as it relates to harmonic ranking. Harmonics of the first file (the file to be harmonically transformed) are compared to a target sound file to match the attack, sustain, and decay characteristics of the second file's harmonics.

Since there will not be a one-to-one match of harmonics, comparative analysis will be required by the algorithm to create rules for adjustments. This process can also be aided by input from the user when general processing occurs.

An example of such manipulation can be seen with a flute and piano. FIGS. 8*a* through 8*d* show spectral content plots for the piano and the flute at specific points in time. FIG. 8*a* shows the spectral content of a typical flute early in a note. FIG. 8*b* shows the flute's harmonic content much later in the same note. FIG. 8*c* shows the same note at the same relative point in time as 8*a* from a typical piano. At these points in time, there are large amounts of upper harmonic energy. However, later in time, the relative harmonic content of each note has changed significantly. FIG. 8*d* is at the same relative point in time for the same note as 8*b*, but on the piano. The piano's upper harmonic content is much sparser than that of the flute at this point in the note.

Since one sound file can be made to more closely resemble a vast array of other sound sources, the information need not come directly from a second sound file. A model may be developed via a variety of means. One method would be to general characterize another sound based on its behavior in time, focusing on the characteristic harmonic or partial content behavior. Thus, various mathematical or other logical rules can be created to guide the processing of each harmonic of the sound file that is to be changed. The model files may be created from another sound file, may be completely theoretical models, or may, in fact, be arbitrarily defined by a user.

Suppose a user wishes to make a piano sound like a flute; this process requires considering the relative characteristics of both instruments. A piano has a large burst of energy in its harmonics at the outset of a note, followed by a sharp fall-off in energy content. In comparison, a flute's initial attack is less pronounced and has inharmonicities. With the present invention, each harmonic of the piano would be adjusted accordingly during this phase of every note so as to approximate or, if needed, synthesize corresponding harmonics and missing partials of the flute.

During the sustain portion of a note on a piano, its upper harmonic energy content dies out quickly, while on a flute the upper harmonic energy content exists throughout the duration of the note. Thus, during this portion, continued dynamic adjustment of the piano's harmonics is required. In fact, at some point, synthesis is required to replace harmonic content when the harmonics drop to a considerably lower level. Finally, on these two instruments the decay of a note is slightly different as well, and appropriate adjustment is again needed to match the flute.

This is achieved by the usage of digital filters, adjustment parameters, thresholds, and sine wave synthesizers which are used in combination and which move with or anticipate shifts in a variety of aspects of signals or notes of interest, including the fundamental frequency.

Harmonic and Other Partial Accentuation

In the present invention, Harmonic and other Partial Accentuation provides a method of adjusting sine waves, partials, inharmonicities, harmonics, or other signals based upon their amplitude in relation to the amplitude of other signals within associated frequency ranges. It is an alteration of harmonic adjustment using amplitudes in a frequency range to replace harmonic ranking as a filter amplitude position guide or criteria. Also, as in Harmonic Adjustment, the partial's frequencies are the filters frequency adjusting guide because partials move in frequency as well as amplitude. Among the many audio elements typical of musical passages or other complex audio signals, those which are weak may, with the present invention, be boosted relative to the others, and those which are strong may be cut relative to the others, with or without compressing their dynamic range as selected by the user.

The present inventions (1) isolate or highlight relatively quiet sounds or signals; (2) diminish relatively loud or other selected sounds or signals, including among other things background noise, distortion, or distracting, competing, or other audio signals deemed undesirable by the user; and (3) effect a more intelligible or otherwise more desirable blend of partials, voices, musical notes, harmonics, sine waves, other sounds or signals; or portions of sounds or signals.

Conventional electronic compressors and expanders operate according to only a very few of the parameters which are considered by the present invention, and by no means all of them. Furthermore, the operation of such compression/expansion devices is fundamentally different than that of the present invention. With Accentuation, the adjustment of a signal is based not only upon its amplitude but can also be by its amplitude relative to amplitudes of other signals within its frequency range. For example, the sound of feet shuffling across a floor may or may not need to be adjusted in order to be heard. In an otherwise quiet room the sound may need no adjustment, whereas the same sound at the same amplitude occurring against a backdrop of strongly competing partials, sounds or signals may require accentuation in order to be heard. The present invention can make such a determination and act accordingly.

In one method of the present invention, a piece of music is digitized and amplitude modified to accentuate the quiet partials. Present technology accomplishes this by compressing the music in a fixed frequency range so that the entire signal is affected based on its overall dynamic range. The net effect is to emphasize quieter sections by amplifying the quieter passages. This aspect of the present invention works on a different principle. Computer software examines a spectral range of a complex waveform and raises the level of individual partials that are below a particular set threshold level. Likewise, the level of partials that are above a particular threshold may be lowered in amplitude. Software will examine all partial frequencies in the complex waveform over time and modify only those within the thresholds set for change. In this method, analog and digital hardware and software will digitize music and store it in some form of memory. The complex waveforms will be examined to a high degree of accuracy with Fast Fourier Transforms, wavelets, and/or other appropriate analysis methods. Associated software will compare over time calculated partials to amplitude, frequency, and time thresholds and/or parameters, and decide which partial frequencies will be within the thresholds for amplitude modification. These thresholds are dynamic and are dependent upon the competing partials surrounding the partial slated for adjustment within some specified frequency range on either side.

This part of the present invention acts as a sophisticated, frequency-selective equalization or filtering device where the number of frequencies that can be selected will be almost unlimited. Digital equalization windows will be generated and erased so that partials in the sound that were hard to hear are now more apparent to the listener by modifying their start, peak, and end amplitudes.

As the signal of interest's amplitude shifts relative to other signals' amplitudes, the flexibility of the present invention allows adjustments to be made either (1) on a continuously variable basis, or (2) on a fixed, non-continuously variable basis. The practical effect is the ability not only to pinpoint portions of audio signals that need adjustment and to make such adjustments, but also to make them when they are needed, and only when they are needed. Note that if the filter changes are faster than about 30 cycles per second, they will create their own sounds. Thus, changes at a rate faster than this are not proposed unless low bass sounds can be filtered out.

The present invention's primary method (or combinations thereof) entails filters that move in frequency and amplitude according to what's needed to effect desired adjustments to a particular partial (or a fragment thereof) at a particular point in time.

In a secondary method of the present invention, the processing is "handed off" in a "bucket-brigade" fashion as the partial set for amplitude adjustment moves from one filter's range into the next filter's range.

The present invention can examine frequency, frequency over time, competing partials in frequency bands over time, amplitude, and amplitude over time. Then, with the use of frequency and amplitude adjustable filters, mathematical models, or algorithms, it dynamically adjusts the amplitudes of those partials, harmonics, or other signals (or portions thereof) as necessary to achieve the goals, results or effects as described above. In both methods, after assessing the frequency and amplitude of a partial, other signals, or portion thereof, the present invention determines whether to adjust the signal up, down, or not at all, based upon thresholds.

Accentuation relies upon amplitude thresholds and adjustment curves. There are three methods of implementing thresholds and adjustments in the present invention to achieve desired results. The first method utilizes a threshold that dynamically adjusts the amplitude threshold based on the overall energy of the complex waveform. The energy threshold maintains a consistent frequency dependence (i.e. the slope of the threshold curve is consistent as the overall energy changes). The second method implements an interpolated threshold curve within a frequency band surrounding the partial to be adjusted. The threshold is dynamic and is localized to the frequency region around this partial. The adjustment is also dynamic in the same frequency band and changes as the surrounding partials within the region change in amplitude. Since a partial may move in frequency, the threshold and adjustment frequency band are also frequency-dynamic, moving with the partial to be adjusted as it moves. The third utilizes a fixed threshold level. Partials whose amplitude are above the threshold are adjusted downward. Those below the threshold and above the noise floor are adjusted upwards in amplitude. These three methods are discussed below.

In all three methods, the adjustment levels are dependent on a "scaling function". When a harmonic or partial exceeds or drops below a threshold, the amount it exceeds or drops below the threshold determines the extent of the adjustment. For example, a partial that barely exceeds the upper threshold will only be adjusted downward by a small amount, but exceeding the threshold further will cause a larger adjustment to occur. The transition of the adjustment amount is a continuous function. The simplest function would be a linear function, but any scaling function may be applied. As with any mathematical function, the range of the adjustment of the partials exceeding or dropping below the thresholds may be either scaled or offset. When the scaling function effect is scaled, the same amount of adjustment occurs when a partial exceeds a threshold, regardless of whether the threshold has changed. For example, in the first method listed above, the threshold changes when there is more energy in the waveform. The scaling function may still range between 0% and 25% adjustment of the partial to be adjusted, but over a smaller amplitude range when there is more energy in a waveform. An alternative to this is to just offset the scaling function by some percentage. Thus, if more energy is in the signal, the range would not be the same. it may now range from 0% to only 10%, for example. But, the amount of change in the adjustment would stay consistent relative to the amount of energy the partial exceeded the threshold.

Figure 9A:
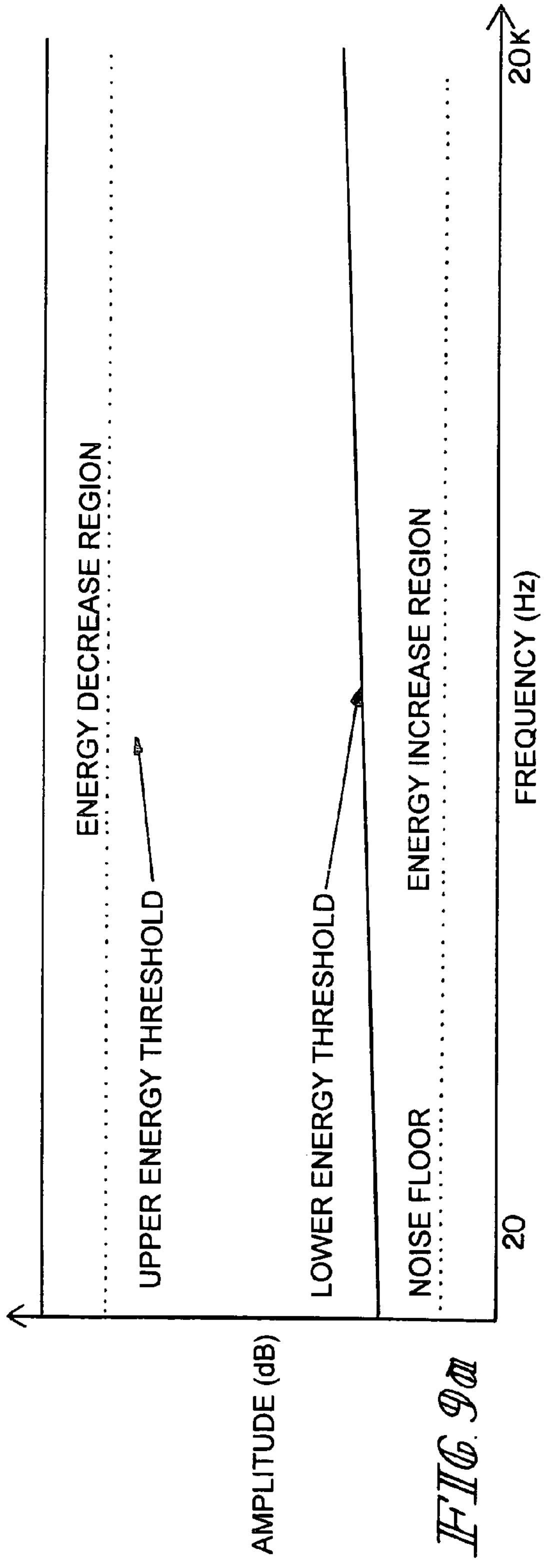
FIG. 9A is a graph showing potential threshold curves for performing an accentuation method according to the present invention.

By following the first threshold and adjustment method, it may be desirable to affect a portion of the partial content of a signal by defining minimum and maximum limits of amplitude. Ideally, such processing keeps a signal within the boundaries of two thresholds: an upper limit, or ceiling; and a lower limit, or floor. Partial's amplitudes are not permitted to exceed the upper threshold or to fall beneath the lower threshold longer than a set period. These thresholds are frequency-dependent as illustrated in FIG. 9A. A noise floor must be established to prevent the adjustment of partials that are actually just low-level noises. The noise floor acts as an overall lower limit for accentuation and may be established manually or through an analysis procedure. Each incoming partial may be compared to the two threshold curves, then adjusted upwards (boosted in energy), downwards (decreased in energy), or not at all. Because any boosts or cuts are relative to the overall signal amplitude in the partial's frequency range, the threshold curves likewise vary depending upon the overall signal energy at any given point in time. Adjustment amounts vary according to the level of the partial. As discussed above, the adjustment occurs based on the scaling function. The adjustment then varies dependent upon the amount of energy that the partial to be adjusted exceeds or drops below the threshold.

In the second threshold and adjustment method, a partial is compared to "competing" partials in a frequency band surrounding the partial to be adjusted in the time period of the partial. This frequency band has several features. These are shown in FIG. 9D. 1) The width of the band can be modified according to the desired results. 2) The shape of the threshold and adjustment region is a continuous curve, and is smoothed to meet the "linear" portion of the overall curve. The linear portion of the curve represents the frequencies outside of the comparison and adjustment region for this partial. However, the overall "offset" of the linear portion of the curve is dependent upon the overall energy in the waveform. Thus, one may see an overall shift in the offset of threshold, but the adjustment of the particular partial may not change, since it's adjustment is dependent upon the partials in its own frequency region. The upper threshold in the frequency band of comparison raises with competing partials. The scaling function for the adjustment of a partial above the threshold line shifts or re-scales as well. The lower threshold in the frequency band of comparison lowers with competing partials. Again, the scaling function for the adjustment of a partial shifts or re-scales as well. 3) When a partial exceeds or drops below the threshold, its adjustment is dependent upon how much the amplitude exceeds or drops below the threshold. The adjustment amount is a continuous parameter that is also offset by the energy in the competing partials surrounding the partial being followed. For example, if the partial barely exceeds the upper threshold, it may be adjusted downward in amplitude by only, say, 5%. A more extreme case may see that partial adjusted by 25% if its amplitude were to exceed the upper threshold by a larger amount. However, if the overall signal energy were different, this adjustment amount would be offset by some percentage, relating to an overall shift in the threshold offset. 4) A noise floor must be established to prevent the adjustment of partials that are actually just low-level noises. The noise floor acts as an overall lower limit for accentuation consideration and may be established manually or through an analysis procedure.

In the third threshold and adjustment method, all of the same adjustment methods are employed, but the comparison is made to a single fixed threshold. FIG. 9*c* shows an example of such a threshold. When a partial exceeds or drops below the threshold, its adjustment is dependent upon how much the amplitude exceeds or drops below the threshold. The adjustment amount is a continuous parameter that is also offset or re-scaled by the energy in the partials. Again a noise floor must be established to prevent the adjustment of partials that are actually just low-level noises, as stated in the previous methods.

In all threshold and adjustment methods, the thresholds (single threshold or separate upper and lower thresholds) may not be flat, because the human ear itself is not flat. The ear does not recognize amplitude in a uniform or linear fashion across the audible range. Because our hearing response is frequency-dependent (some frequencies are perceived to have greater energy than others), the adjustment of energy in the present invention is also frequency-dependent.

By interpolating the adjustment amount between a maximum and minimum amplitude adjustment, a more continuous and consistent adjustment can be achieved. For example, a partial with an amplitude near the maximum level (near clipping) would be adjusted downward in energy more than a partial whose amplitude was barely exceeding the downward-adjustment threshold. Time thresholds are set so competing partials in a set frequency range have limits. Threshold curves and adjustment curves may represent a combination of user-desired definitions and empirical perceptual curves based on human hearing.

Figure 9B:
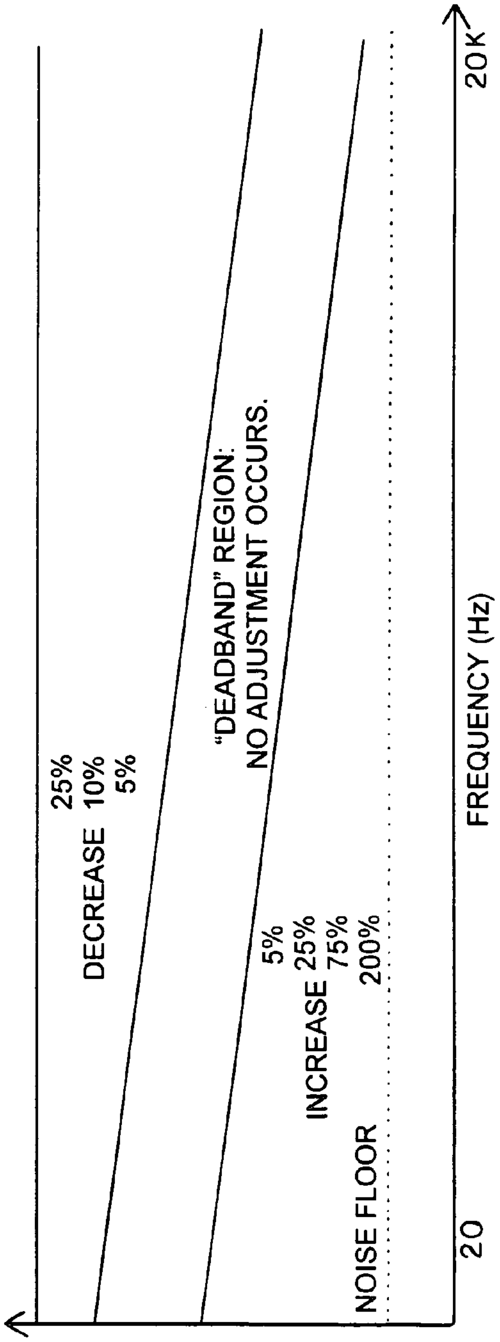
FIG. 9B is a graph illustrating potential low levels of adjustment to be used with FIG. 9A.
Figure 9C:
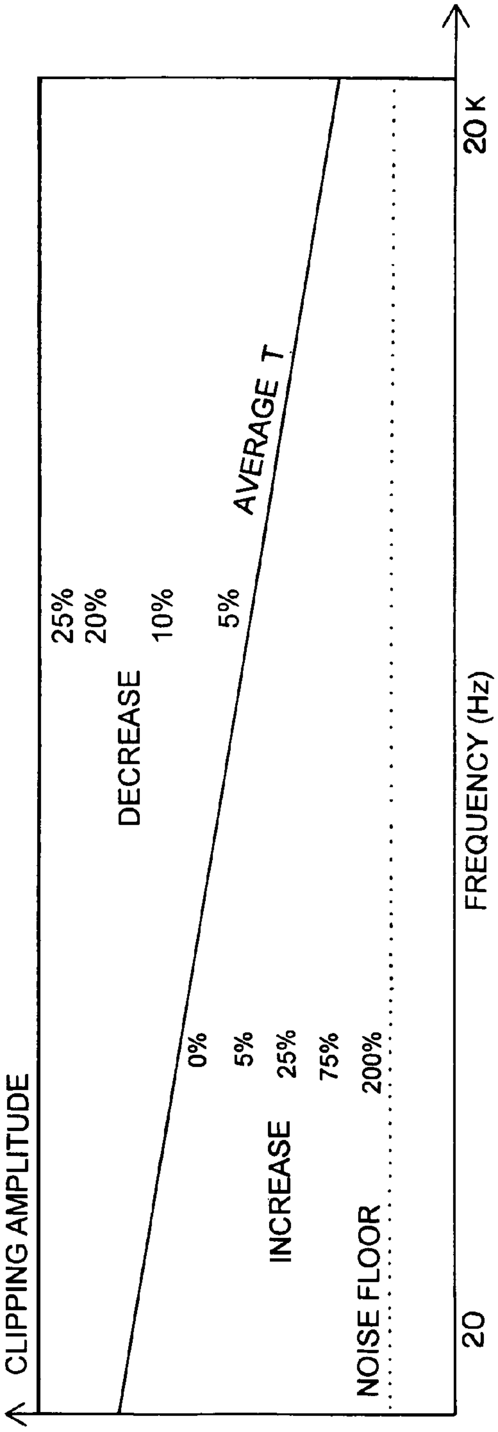
FIG. 9C is a graph illustrating a potential fixed-threshold method of Harmonic and other Partial Accentuation.
Figure 9D:
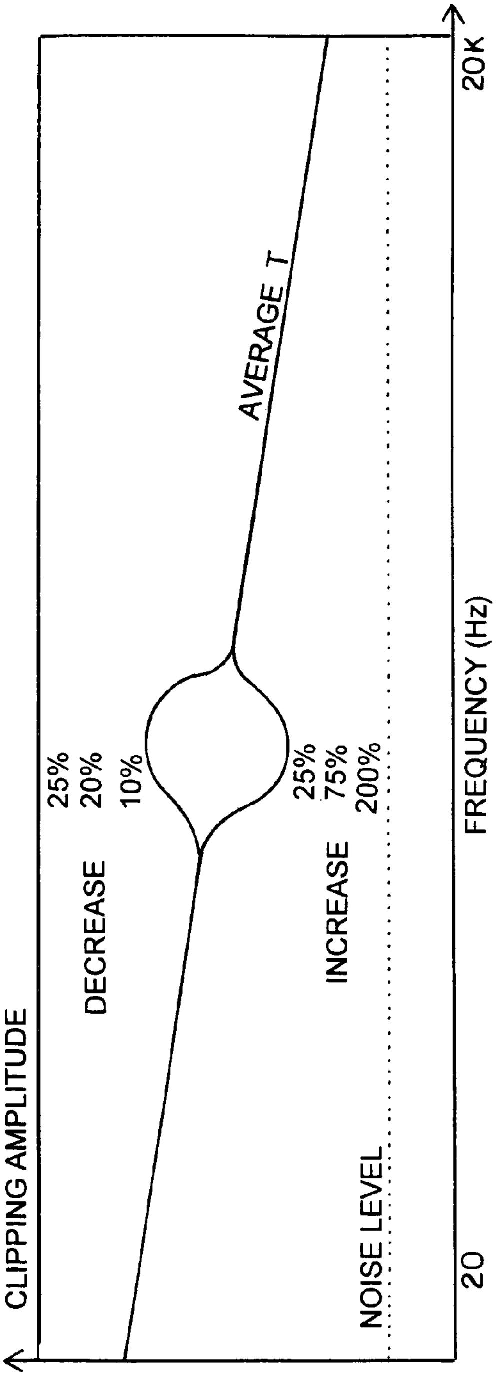
FIG. 9D is a graph illustrating a frequency band dynamic threshold example curve for one method of Harmonic and other Partial Accentuation.
Figure 10:
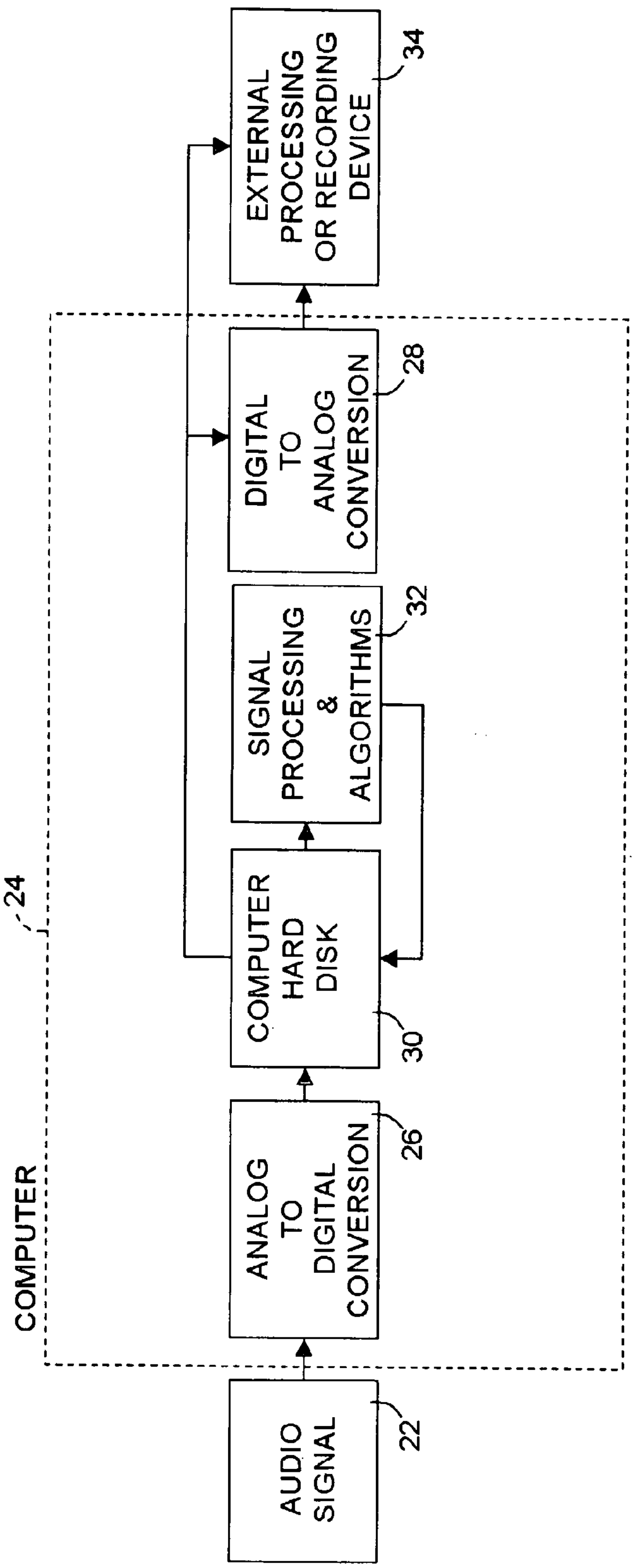
FIG. 10 is a block diagram of a system for performing the operations of the present invention.

FIG. 9A shows a sample threshold curve and FIG. 9B an associated sample adjustment curve for threshold and adjustment method 1. The thresholds are dependent upon the overall signal energy (e.g., a lower overall energy would lower the thresholds). When an incoming partial's amplitude exceeds the upper energy threshold curve, or ceiling of FIG. 9A, the partial is cut (adjusted downward) in energy by an amount defined by the associated adjustment curve for that frequency of FIG. 9B. Likewise, when a partial's amplitude drops below the lower energy threshold curve, or floor, its energy is boosted (adjusted upward), once again by an amount defined by the associated adjustment function for that frequency. The increase and/or reduction in amplitude may be by some predetermined amount.

The adjustment functions of FIG. 9B define the maximum amount of adjustment made at a given frequency. To avoid introducing distortion into the partial's amplitude, the amount of adjustment is tapered in time, such that there is a smooth transition up to the maximum adjustment. The transition may be defined by an arbitrary function, and may be as simple as a linear pattern. Without a gradual taper, a waveform may be adjusted too quickly, or create discontinuities, which create undesirable and/or unwanted distortions in the adjusted signal. Similarly, tapering is also applied when adjusting the partial upward.

FIG. 9C shows an example that relates to the second threshold and adjustment method.

Over the duration of a signal, its harmonics/partials may be fairly constant in amplitude, or they may vary, sometimes considerably, in amplitude. These aspects are frequency and time dependent, with the amplitude and decay characteristics of certain harmonics behaving in one fashion in regard to competing partials.

Aside from the previously discussed thresholds for controlling maximum amplitude and minimum amplitude of harmonics (either as individual harmonics or as groups of harmonics), there are also time-based thresholds which may be set by the user. These must be met in order for the present invention to proceed with its adjustment of partials.

Time-based thresholds set the start time, duration, and finish time for a specified adjustment, such that amplitude thresholds must be met for a time period specified by the user in order for the present invention to come into play. If an amplitude threshold is exceeded, for example, but does not remain exceeded for the time specified by the user, the amplitude adjustment is not processed. For example, a signal falling below a minimum threshold either (1) once met that threshold and then fell below it; or (2) never met it in the first place also are not adjusted. It is useful for the software to recognize such differences when adjusting signals and be user adjustable.

Interpolation

In general terms, interpolation is a method of estimating or calculating an unknown quantity in between two given quantities, based on the relationships among the given quantities and known variables. In the present invention, interpolation is applicable to Harmonic Adjustment, Harmonic Adjustment and Synthesis, Partial Transformation, and Harmonic Transformation. This refers to a method by which the user may adjust the harmonic structure of notes at certain points sounded either by an instrument or a human voice. The shift in harmonic structure all across the musical range from one of those user-adjusted points to the other is then affected by the invention according to any of several curves or contours or interpolation functions prescribed by the user. Thus the changing harmonic content of played notes is controlled in a continuous manner.

The sound of a voice or a musical instrument may change as a function of register. Because of the varying desirability of sounds in different registers, singers or musicians may wish to maintain the character or timbre of one register while sounding notes in a different register. In the present invention, interpolation not only enables them to do so but also to adjust automatically the harmonic structures of notes all across the musical spectrum from one user-adjusted point to another in a controllable fashion.

Suppose the user desires an emphasis on the 3rd harmonic in a high-register note, but an emphasis on the 10th harmonic in the middle register. Once the user has set those parameters as desired, the present invention automatically effects a shift in the harmonic structure of notes in between those points, with the character of the transformation controllable by the user.

Simply stated, the user sets harmonics at certain points, and interpolation automatically adjusts everything in between these "set points." More specifically, it accomplishes two things:

First, the user may adjust the harmonic structure of a note (or group of notes within a selected range) of a voice or instrument at different points within that voice or instrument's range; in doing so, the user may be correcting perceived deficiencies in the sound, or adjusting the sound to produce special effects, or emphasizing harmonics deemed desirable, or diminishing or deleting harmonics deemed undesirable, or whatever the case may be;

Second, once the user has adjusted the sounds of these selected notes or registers, the present invention shifts or transforms the harmonic structure of all notes and all perceived harmonics all across the musical spectrum in between the set points, according to a formula pre-selected by the user.

The interpolation function (that is, the character or curve of the shift from one set point's harmonic structure to another) may be linear, or logarithmic, or of another contour selected by the user.

A frequency scale can chart the location of various notes, harmonics, partials, or other signals. For example, a scale might chart the location of frequencies an octave apart. The manner in which the present invention adjusts all harmonic structures between the user's set points may be selected by the user.

Imitating Natural Harmonics

A good model of harmonic frequencies is $f_n=n\times f_1\times S^{\log_2 n}$ because it can be set to approximate natural "sharping" in broad resonance bands. For example, the $10^{th}$ harmonic of $f_1=185$ Hz is 1862.3 Hz instead of 1850 Hz using 10×185. More importantly, it is the one model which simulates consonant harmonics, e.g., harmonic 1 with harmonic 2, 2 with 4, 3 with 4, 4 with 5, 4 with 8, 6 with 8, 8 with 10, 9 with 12, etc. When used to generate harmonics those harmonics will reinforce and ring even more than natural harmonics do. It can also be used for harmonic adjustment and synthesis, and natural harmonics. This function or model is a good way of finding closely matched harmonics that are produced by instruments that "sharp" higher harmonics. In this way, the stretch function can be used in Imitating Natural Harmonics INH.

The function $f_n=f_1\times n\times S^{\log_2 n}$ is used to model harmonics which are progressively sharper as n increases. S is a sharping constant, typically set between 1 and 1.003 and n is a positive integer 1, 2, 3, . . . , T, where T is typically equal to 17. With this function, the value of S determines the extent of that sharping. The harmonics it models are consonant in the same way harmonics are consonant when $f_n=n<f_1$. I.e., if $f_n$ and $f_m$ are the $n^{th}$ and $m^{th}$ harmonics of a note, then $f_n/f_m=f_{2n}/f_{2m}=f_{3n}/f_{3m}= \ldots =f_{kn}/f_{km}$.

There are multitudes of methods that can be utilized to determine the fundamental and harmonic frequencies, such as Fast-Find Fundamental, or the explicit locating of frequencies through filter banks or auto-correlation techniques. The degree of accuracy and speed needed in a particular operation is user-defined, which helps aid in selecting the appropriate frequency-finding algorithm.

Separating Harmonics for Effects

A further extension of the present invention and its methods allows for unique manipulations of audio, and application of the present invention to other areas of audio processing. Harmonics of interest are selected by the user and then separated from the original data by the use of previously mentioned variable digital filters. Filtering methods used to separate the signal may be of any method, but particularly applicable are digital filters whose coefficients may be recalculated based on input data.

The separated harmonic(s) are then fed to other signal processing units (e.g., effects for instruments such as reverberation, chorus, flange, etc.) and finally mixed back into the original signal in a user-selected blend or proportion.

Implementation

One implementation variant includes a source of audio signals 22 connected to a host computer system, such as a desktop personal computer 24, which has several add-in cards installed into the system to perform additional functions. The source 32 may be live or from a stored file. These cards include Analog-to-Digital Conversion 26 and Digital-to-Analog Conversion 28 cards, as well as an additional Digital Signal Processing card that is used to carry out the mathematical and filtering operations at a high speed. The host computer system controls mostly the user-interface operations. However, the general personal computer processor may carry out all of the mathematical operations alone without a Digital Signal Processor card installed.

The incoming audio signal is applied to an Analog-to-Digital conversion unit 26 that converts the electrical sound signal into a digital representation. In typical applications, the Analog-to-Digital conversion would be performed using a 20 to 24-bit converter and would operate at 48 kHz–96 kHz [and possibly higher] sample rates. Personal computers typically have 16-bit converters supporting 8 kHz–44.1 kHz sample rates. These may suffice for some applications. However, large word sizes—e.g., 20 bits, 24 bits, 32 bits—provide better results. Higher sample rates also improve the quality of the converted signal. The digital representation is a long stream of numbers that are then stored to hard disk 30. The hard disk may be either a stand-alone disk drive, such as a high-performance removable disk type media, or it may be the same disk where other data and programs for the computer reside. For performance and flexibility, the disk is a removable type.

Once the digitized audio data is stored on the disk 30, a program is selected to perform the desired manipulations of the signal. The program may actually comprise a series of programs that accomplish the desired goal. This processing algorithm reads the computer data from the disk 32 in variable-sized units that are stored in Random Access Memory (RAM) controlled by the processing algorithm. Processed data is stored back to the computer disk 30 as processing is completed.

In the present invention, the process of reading from and writing to the disk may be iterative and/or recursive, such that reading and writing may be intermixed, and data sections may be read and written to many times. Real-time processing of audio signals often requires that disk accessing and storing of the digital audio signals be minimized, as it introduces delays into the system. By utilizing RAM only, or by utilizing cache memories, system performance can be increased to the point where some processing may be able to be performed in a real-time or quasi real-time manner. Real-time means that processing occurs at a rate such that the results are obtained with little or no noticeable latency by the user. Dependent upon the processing type and user preferences, the processed data may overwrite or be mixed with the original data. It also may or may not be written to a new file altogether.

Upon completion of processing, the data is read from the computer disk or memory 30 once again for listening or further external processing 34. The digitized data is read from the disk 30 and written to a Digital-to-Analog conversion unit 28, which converts the digitized data back to an analog signal for use outside the computer 34. Alternately, digitized data may written out to external devices directly in digital form through a variety of means (such as AES/EBU or SPDIF digital audio interface formats or alternate forms). External devices include recording systems, mastering devices, audio-processing units, broadcast units, computers, etc.

Processing occurs at a rate such that the results are obtained with little or no noticeable latency by the user. Dependent upon the processing type and user preferences, the processed data may overwrite or be mixed with the original data. It also may or may not be written to a new file altogether.

Upon completion of processing, the data is read from the computer disk or memory 30 once again for listening or further external processing 34. The digitized data is read from the disk 30 and written to a Digital-to-Analog conversion unit 28, which converts the digitized data back to an analog signal for use outside the computer 34. Alternately, digitized data may written out to external devices directly in digital form through a variety of means (such as AES/EBU or SPDIF digital audio interface formats or alternate forms). External devices include recording systems, mastering devices, audio processing units, broadcast units, computers, etc.

Fast Find Harmonics

The implementations described herein may also utilize technology such as Fast-Find Fundamental Method. This Fast-Find Method technology uses algorithms to deduce the fundamental frequency of an audio signal from the harmonic relationship of higher harmonics in a very quick fashion such that subsequent algorithms that are required to perform in real-time may do so without a noticeable (or with an insignificant) latency. And just as quickly the Fast Find Fundamental algorithm can deduce the ranking numbers of detected higher harmonic frequencies and the frequencies and ranking numbers of higher harmonics which have not yet been detected—and it can do this without knowing or deducing the fundamental frequency.

The method includes selecting a set of at least two candidate frequencies in the signal. Next, it is determined if members of the set of candidate frequencies form a group of legitimate harmonic frequencies having a harmonic relationship. It determines the ranking number of each harmonic frequency. Finally, the fundamental frequency is deduced from the legitimate frequencies.

In one algorithm of the method, relationships between and among detected partials are compared to comparable relationships that would prevail if all members were legitimate harmonic frequencies. The relationships compared include frequency ratios, differences in frequencies, ratios of those differences, and unique relationships which result from the fact that harmonic frequencies are modeled by a function of an integer variable. Candidate frequencies are also screened using the lower and higher limits of the fundamental frequencies and/or higher harmonic frequencies which can be produced by the source of the signal.

The algorithm uses relationships between and among higher harmonics, the conditions which limit choices, the relationships the higher harmonics have with the fundamental, and the range of possible fundamental frequencies. If $f_n=f_1\times G(n)$ models harmonic frequencies where $f_n$ is the frequency of the nth harmonic, $f_1$ is the fundamental frequency, and n is a positive integer, examples of relationships between and among partial frequencies which must prevail if they are legitimate harmonic frequencies, stemming from the same fundamental, are:

a) Ratios of candidate frequencies $f_H$, $f_M$, $f_L$, must be approximately equal to ratios obtained by substituting their ranking numbers $R_H$, $R_M$, $R_L$ in the model of harmonics, i.e., $f_H \div f_M \approx G(R_H) \div G(R_M)$, and $f_M \div f_L \approx G(R_M) \div G(R_L)$.

b) The ratios of differences between candidate frequencies must be consistent with ratios of differences of modeled frequencies, i.e., $(R_H-R_M)\div(R_M-R_L)\approx\{G(_R)-G(R_M)\div G(R_M)-G(R_L)\}$.

c) The candidate frequency partials $f_H$, $f_M$, $f_L$ must be in the range of frequencies which can be produced by the source or the instrument.

d) The harmonic ranking numbers $R_H$, $R_M$, $R_L$ must not imply a fundamental frequency which is below $F_L$ or above $F_H$, the range of fundamental frequencies which can be produced by the source or instrument.

e) When matching integer variable ratios to obtain possible trios of ranking numbers, the integer $R_M$ in the integer ratio $R_H/R_M$ must be the same as the integer $R_M$ in the integer ratio $R_M/R_L$, for example. This relationship is used to join Ranking Number pairs $\{R_H, R_M\}$and $\{R_M, R_L\}$into possible trios $\{R_H, R_M, R_L\}$.

Another algorithm uses a simulated "slide rule" to quickly identify sets of measured partial frequencies which are in harmonic relationships and the ranking numbers of each and the fundamental frequencies from which they stem. The method incorporates a scale on which harmonic multiplier values are marked corresponding to the value of G(n) in the equation $f_n=f_1\times G(n)$. Each marked multiplier is tagged with the corresponding value of n. Frequencies of measured partials are marked on a like scale and the scales are compared as their relative positions change to isolate sets of partial frequencies which match sets of multipliers. Ranking numbers can be read directly from the multiplier scale. They are the corresponding values of n.

Ranking numbers and frequencies are then used to determine which sets are legitimate harmonics and the corresponding fundamental frequency can also be read off directly from the multiplier scale.

For a comprehensive description of the algorithms mentioned above, and of other related algorithms, refer to PCT application PCT/US99/25294 "Fast Find Fundamental Method", WO 00/26896, 11 May 2000. A detailed explanation of the Fast-Find Fundamental method can be found in corresponding U.S. Pat. No. 6,766,288 issued on Jul. 30, 2004.

Another Implementation

The present invention does not rely solely on Fast-Find Fundamental to perform its operations. There are many methods that can be utilized to determine the location of fundamental and harmonic frequencies having been given the amplitude of narrow frequency bands, by such measurement methods as Fast Fourier Transform, filter banks, zero-crossing method or comb filters.

Figure 11:
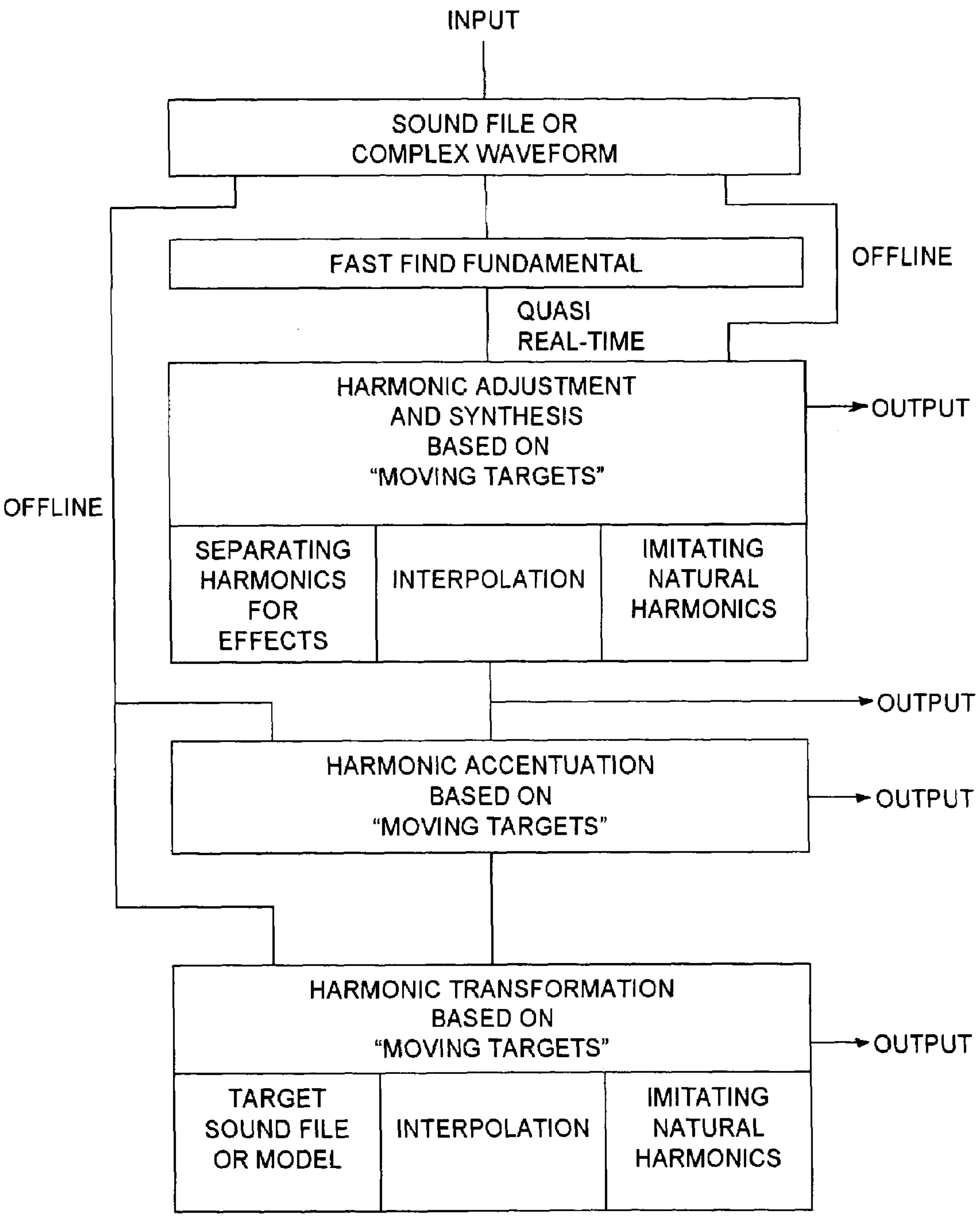
FIG. 11 is a block diagram of the software or method steps incorporating the principles of the present invention.

The potential inter-relationship of the various systems and methods for modifying complex waveforms according to the principles of the present invention are illustrated in FIG. 11. Input signals provided to a sound file as complex waveforms. This information can then be provided to a Fast Find Fundamental method or circuitry. This may be used to quickly determine the fundamental frequency of a complex waveform or as a precursor to provide information for further Harmonic Adjustment and/or Synthesis.

Harmonic Adjustment and/or Synthesis is based on modifying devices being adjustable with respect to amplitude and frequency. In an offline mode, the Harmonic Adjustment/Synthesis would receive its input directly from the sound file. The output can be just from Harmonic Adjustment and Synthesis.

Alternatively, Harmonic Adjustment and Synthesis signal in combination with any of the methods disclosed herein may be provided as an output signal.

Harmonic and Partial Actuation based on moving targets may also receive an input signal off-line directly from the input of the sound file of complex waveforms or as an output form the Harmonic Adjustment and/or Synthesis. It provides an output signal either out of the system or as a input to Harmonic Transformation. The Harmonic Transformation is based as well as on moving target and includes target files, interpolation and imitating natural harmonics.

The present invention has been described in words such that the description is illustrative of the matter. The description is intended to describe the present invention rather than in a manner of limitation. Many modifications, combinations, and variations are possible of the methods provided above. It should therefore be understood that the invention may be practiced in ways other than specifically described herein.

The invention claimed is:

1. A method of modifying the amplitudes of harmonics of a detected tone spectrum in a complex waveform, the method comprising:

determining a dynamic energy threshold, as a function of frequency, from detected energy of partials:

continually determining an amplitude modification for each selected rank of the harmonics relative to the threshold; and applying the determined modification with an amplitude modifying function to each harmonic of the detected tone spectrum selected by harmonic rank, where the frequency associated with each amplitude modifying function is continually set to the frequency corresponding to the harmonic rank as the frequencies of the detected tone spectrum containing the selected harmonics change over time.

2. The method according to claim 1, wherein the amplitude modifying functions are adjustable with respect to at least one of frequency and amplitude.

3. The method according to claim 1, including assigning a harmonic rank to each amplitude modifying function and setting the frequency of the amplitude modifying function to the frequency of the harmonic of that rank as the frequency of the harmonic changes.

4. The method according to claim 3, including assigning an amplitude change to each amplitude modifying function.

5. The method according to claim 1, wherein the amplitude modifying functions are set to fixed frequencies; applying the amplitude modifying function to a selected harmonic when the frequency of the amplitude amplifying function and the harmonic correspond; and adjusting the amplitude modification of the amplitude modifying function as a function of the selected rank of the harmonics.

6. The method according to claim 1, including using the methods of Fast Find Fundamental to determine the ranks of the harmonic frequencies of the detected tone spectrum.

7. The method according to claim 1, including determining which partials are harmonics of a harmonic tone spectrum and their harmonic ranks using the methods of Fast Find Fundamental.

8. The method according to claim 1, wherein the amplitude modifying function varies in frequency and amplitude with time.

9. The method according to claim 1, including comparing a first selected harmonics amplitude to a second selected harmonics amplitude within the same tone spectrum and adjusting the first harmonics amplitude relative to the second selected harmonics amplitude based on the comparison and rank.

10. The method according to claim 1, including using the amplitude modifying function to synthesize harmonics of selected harmonic ranks and adding the synthesized harmonic frequencies to the waveform.

11. The method according to claim 10, wherein the harmonics are synthesized using a modeling function $f_n=f_1\times n\times S^{log_2 n}$, where S is a constant greater than 1 and n is the rank of the harmonic.

12. The method according to claim 1, including using the amplitude modifying function to synthesize selected inharmonicities and adding the synthesized inharmonicities to the waveform.

13. The method according to claim 1, wherein the amplitude modifying function includes modifying detected partials of the complex waveform by frequency, amplitude, and time and by harmonic rank to resemble a second source complex waveform.

14. The method according to claim 1, wherein the amplitude modifying function includes synthesizing selected partials of the complex waveform by frequency, amplitude, and time and by harmonic to resemble a second source complex waveform.

15. The method according to claim 1, including setting two or more frequency based parameters; selecting an interpolation function; and adjusting the amplitudes of harmonics based on the frequency based parameters and interpolation function.

16. The method according to claim 1, including:

setting a noise floor threshold as a function of frequency.

17. The method according to claim 16, wherein setting the noise floor threshold as a function of frequency is performed continuously.

18. The method according to claim 17, wherein the noise floor threshold is set as a function of time.

19. The method according to claim 1, wherein the amplitude modifying functions are processed using mathematical models, algorithms, or functions.

20. The method according to claim 1, wherein the amplitude modification changes with the selected rank of harmonic's frequency as the selected rank of harmonic's frequency changes over time.

21. The method according to claim 1, wherein the frequency of each amplitude modifying function is continuously set to the frequency corresponding to the selected rank of harmonic's frequency as the frequency of the selected rank of harmonic changes over time.

22. The method according to claim 1, wherein the dynamic energy threshold is determined from the detected energy of adjacent partials.

23. The method according to claim 1, wherein the dynamic energy threshold is determined from the detected partial's energy and frequency within a time period.

24. The method according to claim 1, wherein the dynamic energy threshold is determined as an average of the detected energy of all of the partials.

25. The method according to claim 1, wherein the dynamic energy threshold is determined for each partial from partial's energy within a frequency band of that partial within a time period.

26. The method according to claim 1, wherein the selected rank of harmonic's amplitude modification is determined by that selected rank of harmonic's amplitude over time and its relation to the thresholds during that time period.

27. The method according to claim 1, wherein selected ranks of harmonics whose energy is above the dynamic energy threshold is adjusted using a scaling function.

28. The method according to claim 1, wherein selected ranks of harmonics whose energy is below the dynamic energy threshold is adjusted using a scaling function.

29. The method according to claim 1, including determining a second dynamic energy thresholds as a function of frequency from the detected energy of the partials.

30. The method according to claim 1, including setting a maximum clipping threshold.

31. The method according to claim 1, wherein the scaling functions are scaled when the threshold levels changes.

32. The method according to claim 16, including not adjusting the amplitude of selected ranks of harmonics having an amplitude less than the noise floor threshold.

33. The method according to claim 1, wherein the selected ranks of harmonic's energies must meet amplitude thresholds for a set time duration before the selected ranks of harmonics are adjusted in amplitude.

34. The method according to claim 33, wherein the time duration may vary.

35. The method according to claim 1, wherein the amplitude modifying function is accomplished using frequency & amplitude adjustable digital filtering methods.

36. The method according to claim 1, wherein the amplitude modifying function is accomplished using fixed frequency, variable amplitude filters processing methods.

37. The method according to claim 1, including storing the method as instructions in a digital signal processor.

38. The method according to claim 37, including passing the detected tone spectrum through a delay buffer.

39. The method according to claim 37, including initially passing the complex waveform through an A/D converter.

40. The method according to claim 1, including storing the complex waveform; and determining over time the tone spectra and its harmonic's frequencies, amplitudes, and harmonic ranks.

41. A machine for performing the method of claim 1.

42. A list of instructions fixed in a machine readable media for performing the method of claim 1.

43. A method of modifying the amplitudes of harmonics of a detected tone spectrum in a complex waveform, the method comprising:

determining a modification to selected ranks of the harmonics based on the frequency and energy of the harmonic relative to detected energy of partials of the detected tone spectrum; and applying the determined modification with an amplitude modifying function to each harmonic of the detected tone spectrum selected by harmonic rank, where the frequency associated with each amplitude modifying function is continually set to the frequency corresponding to the harmonic rank as the frequencies of the detected tone spectrum containing the selected harmonics change over time.

* * * * *